United States Patent
Sasaki et al.

(10) Patent No.: US 6,670,595 B1
(45) Date of Patent: Dec. 30, 2003

(54) PHOTOSENSOR AND PHOTOSENSOR SYSTEM

(75) Inventors: Kazuhiro Sasaki, Sagamihara (JP); Makoto Sasaki, Hachioji (JP); Yasuo Koshizuka, Fussa (JP)

(73) Assignee: Olympus Optical Co., Ltd., Tokyo (JP)

( * ) Notice: Subject to any disclaimer, the term of this patent is extended or adjusted under 35 U.S.C. 154(b) by 189 days.

(21) Appl. No.: 09/630,242

(22) Filed: Jul. 31, 2000

(30) Foreign Application Priority Data

| Aug. 2, 1999 | (JP) | 11-218316 |
| Apr. 10, 2000 | (JP) | 2000-107468 |
| Apr. 24, 2000 | (JP) | 2000-122157 |
| May 31, 2000 | (JP) | 2000-163303 |

(51) Int. Cl.[7] ............................................. H01L 27/00
(52) U.S. Cl. ................................... 250/208.1; 257/291
(58) Field of Search ...................... 250/208.1; 257/443, 257/53, 57, 59, 432, 436, 291, 290

(56) References Cited

U.S. PATENT DOCUMENTS

| 4,744,637 A | * | 5/1988 | Sekimura et al. ............ 349/122 |
| 5,075,237 A |  | 12/1991 | Wu .............................. 438/73 |
| 5,184,200 A | * | 2/1993 | Yamanobe ................... 257/53 |
| 5,200,634 A |  | 4/1993 | Tsukada et al. ............. 257/291 |
| 5,461,419 A | * | 10/1995 | Yamada ....................... 257/302 |
| 5,583,570 A |  | 12/1996 | Yamada ....................... 348/294 |
| 5,583,571 A |  | 12/1996 | Yamada ....................... 348/294 |
| 5,604,360 A | * | 2/1997 | Zhang et al. .................. 368/72 |
| 5,705,411 A |  | 1/1998 | Yamanobe et al. .......... 438/158 |

FOREIGN PATENT DOCUMENTS

| EP | 0 506 378 A1 | | 9/1992 | |
| JP | 9-80470 | * | 3/1997 | G02F/1/136 |
| JP | 09-80470 | * | 3/1997 | G02F/1/136 |
| JP | 10-136392 | * | 5/1998 | H04N/9/07 |

OTHER PUBLICATIONS

Office Action dated Nov. 15, 2001 in counterpart Australian Patent Application No. 61828/00.
Official Action dated Mar. 7, 2002 issued in counterpart Singapore application No. SG 200101914–0, filed Jul. 28, 2000.
Official Action dated Mar. 5, 2002 issued in counterpart Singapore application No. SG 200101914–0, filed Jul. 28, 2000.

* cited by examiner

*Primary Examiner*—Edward J. Glick
*Assistant Examiner*—Chih-Cheng Glen Kao
(74) *Attorney, Agent, or Firm*—Frishauf, Holtz, Goodman & Chick, P.C.

(57) ABSTRACT

A photosensor array is provided with one or more semiconductor layers having carrier generating regions for generating carriers by incident exciting light, and the positions of the carrier generating regions are set arbitrarily so as to equalize the balance of incident light in the direction of two-dimensional travel, so that sensing with less distortion can be achieved.

23 Claims, 18 Drawing Sheets

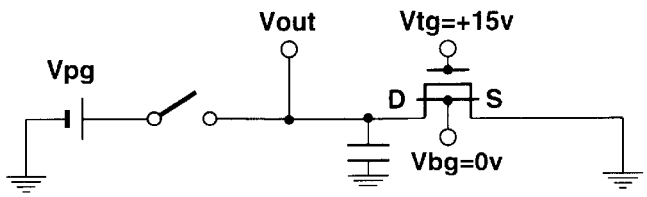
FIG.10 RESET
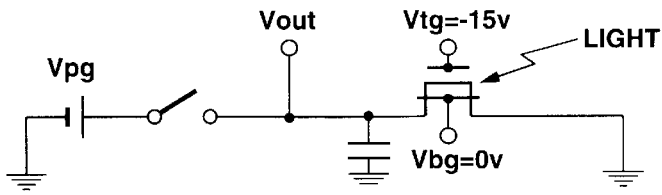
FIG.11 ACCUMULATION
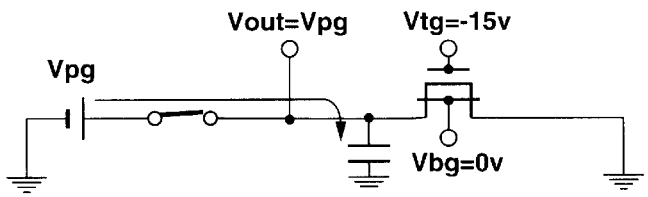
FIG.12 PRECHARGE
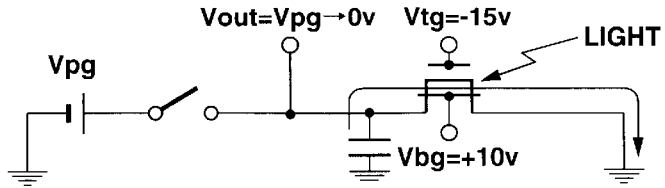
FIG.13 SELECTION IN THE BRIGHT
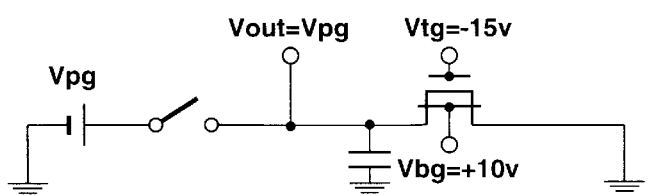
FIG.14 SELECTION IN THE DARK
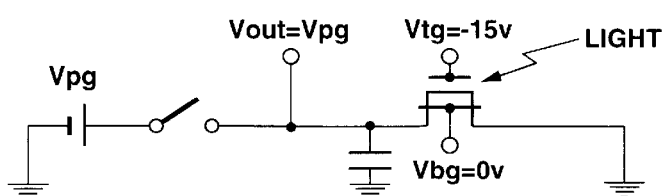
FIG.15 NON-SELECTION IN THE BRIGHT
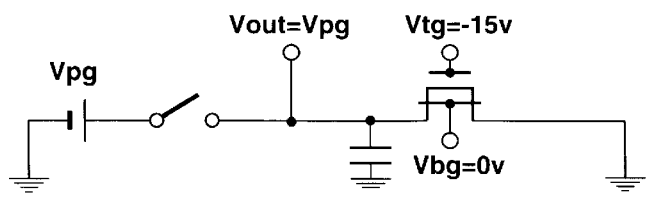
FIG.16 NON-SELECTION IN THE DARK

PHOTOSENSOR AND PHOTOSENSOR SYSTEM

CROSS-REFERENCE TO RELATED APPLICATIONS

This application is based upon and claims the benefit of priority from the prior Japanese Patent Applications No. 11-218316, filed Aug. 2, 1999; No. 2000-107468, filed Apr. 10, 2000; No. 2000-122157, filed Apr. 24, 2000; and No. 2000-163303, filed May 31, 2000, the entire contents of which are incorporated herein by reference.

BACKGROUND OF THE INVENTION

This invention relates to a photosensor for sensing light or an image according to the sensed light and a photosensor system.

One known two-dimensional image reading device for reading printed matter, photographs, or fingerprints by very small irregularities in the finger has a photosensor array composed of photoelectric conversion elements (photosensors) arranged in a matrix. Generally, a solid-state imaging device, such as CCD (Charge-Coupled Device), made of single crystal silicon has been used as a photosensor array. Use of single crystal silicon causes the problem of increasing the manufacturing cost seriously.

It is well known that the CCD has a structure where photodiodes or photosensors are arranged in a matrix, causes a horizontal scanning circuit and a vertical scanning circuit to detect the charges generated according to the amount of light projected on the light-receiving section of each photosensor, and senses the luminance of the projected light. In a photosensor system using such a CCD, because select transistors for respectively bringing the scanned photosensors into the selected state have to be provided independently, an increase in the number of pixels causes the problem of making the overall system larger.

To overcome this problem, an attempt has been recently made to make the system smaller and reduce the manufacturing cost by applying a thin-film transistor with a so-called double-gate structure (hereinafter, referred to as a double-gate photosensor) to an image reading device. The double-gate photosensor is such that a photosensor has a photo sense function and a select transistor function.

The plane structure of a photosensor array composed of such double-gate photosensors PS is so designed, for example, as shown in FIG. 30 that double-gate photosensors PS are arranged with a specific pitch of Psp in a lattice-like form (or in a matrix) in the directions of x and y crossing at right angles and that light from the insulating substrate (or glass substrate) side is projected through the element-to-element region Rp in the lattice onto the subject. Therefore, to project sufficient light on the subject to improve the light-receiving sensitivity, it is necessary to make the element-to-element region Rp as large as possible.

FIG. 31 is a sectional view showing the structure of a double-gate photosensor PS taken along line XXXI—XXXI in FIG. 30. The double-gate photosensor PS comprises a semiconductor layer 1 where electron-hole pairs are generated by incident light, n$^+$ silicon layers 7 provided at both ends of the semiconductor layer 1, a source electrode 2 and a drain electrode 3 which are formed on the n$^+$ silicon layers 7 and shut off light exciting the semiconductor layer 1, a block insulating film 4 provided on the semiconductor layer 1, an upper gate insulating film 5 covering the source electrode 2 and drain electrode 3, a top gate electrode TG formed on the upper gate insulating film 5, a lower gate insulating film 6 below the semiconductor layer 1, a bottom gate electrode BG which is formed below the lower gate insulating film 6 and shuts off light exciting the semiconductor layer, and a transparent substrate 9.

Specifically, the double-gate photosensor PS is such that a combination of two MOS transistors, of an upper MOS transistor composed of the semiconductor layer 1, source electrode 2, drain electrode 3, and top gate electrode TG; and a lower MOS transistor composed of the semiconductor layer 1, source electrode 2, and drain electrode 3, and bottom gate electrode BG, is formed on the transparent insulating substrate 9, such as a glass substrate using the semiconductor layer as a common channel region.

Then, light hv emitted from above the double-gate photosensor PS advances in the direction of the arrow, passes through the top gate electrode TG and transparent insulating films 4, 5, and enters the semiconductor layer 1. In the semiconductor layer 1, electron-hole pairs are generated according to the amount of incident light. By sensing the voltage signal corresponding to the charges, the light-and-shade information on the subject is read.

A photosensor system applied to the aforementioned two-dimensional image reading device has the following problems.

(a) The semiconductor layer 1 in a double-gate photosensor PS is set on the basis of various dimensions determining the channel region, that is, of the ratio of the channel length $L_0$ to channel width $W_0$ in the semiconductor layer 1. The channel length $L_0$ coincides with the length of the block insulating film in the direction of channel length.

The transistor characteristic of the double-gate photosensor PS is generally expressed by the following expression (1):

$$Ids \propto W_0/L_0 \qquad (1)$$

where Ids is a source-drain current value.

The double-gate photosensor system recognizes an image by reading the voltage at the drain electrode 3 that varies with the drain current Ids flowing on the basis of the charges generated in the semiconductor layer 1 according to the amount of incident light. Therefore, to clearly recognize the image of the subject in a high contrast ratio, the difference between the drain current Ids of a double-gate photosensor PS positioned in a dark portion of the subject and the drain current Ids of a double-gate photosensor PS positioned in a bright portion of the subject has to be made larger. Since the source-drain current value Ids that determines the transistor sensitivity of the double-gate photosensor PS is determined on the basis of the ratio of the channel width $W_0$ to channel length $L_0$ in the semiconductor layer 1, it is desirable from the viewpoint of improvement in the transistor sensitivity of the double-gate photosensor PS that the design value of the ratio $W_0/L_0$ should be made as large as possible.

On the other hand, if the ratio $W_0/L_0$ it set to be so that the double-gate photosensor PS is set to a high transistor sensitivity, the plane structure of the semiconductor layer 1 inevitably takes the form of a rectangular shape with a relatively large channel width $W_0$ and a relatively small channel length $L_0$. Because the double-gate photosensor PS senses only the light caused to enter the semiconductor layer 1, only the part not covered by the shade source electrode 2 and drain electrode 3 senses the light entering from above. As shown in FIG. 30, the area in which the light from the semiconductor layer 1 is allowed to enter takes a form of a near rectangle $Ip_0$ with the length of the shorter side being $K_0$ and the length of the longer side being about $W_0$. Since the short-side length $K_0$ basically depends largely on the channel length $L_0$, when the light entering the semiconductor layer 1 is perfect diffuse light or almost perfect diffuse light, the amount of light entering the semiconductor layer 1 in the direction of x is smaller than the amount of light entering the semiconductor layer 1 in the direction of Y, resulting in a noticeable deviation of the incident light in the direction in which it travels.

Specifically, in such a double-gate photosensor PS, because the area of the semiconductor layer 1 constituting the channel region which light is allowed to enter is designed to take the form of a single rectangle $Ip_0$, the light transmitting area at the surface of a protective insulating film that a single double-gate photosensor PS can basically sense is a lengthwise area $Ep_0$ (the area shaded with slanted lines in FIG. 30) substantially similar in shape to a near rectangle $Ip_0$, which narrows, in the sidewise direction (or the direction of x), the area assuring the desired light-receiving sensitivity. Thus, the deviation of the expanse of the light sensing area in the directions of x and y causes distortions in the image read, which prevents the light-and-shade information on the subject from being read accurately. This causes the problem of being unable to simultaneously realize both a high transistor sensitivity and the reading of image information with suppressed distortion. The area $Ep_0$ does not represent the distribution range of the light-receiving sensitivity of the double-gate photosensor PS accurately.

(b) When double-gate photosensors PS are arranged in a matrix, the distances between the light-receiving sections are non-uniform in an oblique direction (0 to 90°) other than the two perpendicular directions (or the directions of x and y) corresponding to the matrix, leading to the deterioration of the reading accuracy. Specifically, the arrangement of double-gate photosensors PS in a photosensor array has the following problem: because double-gate photosensors PS are arranged in only two directions of x and y perpendicular to each other in such a manner that they are spaced at regular intervals of dimension Psp, the pitch between the double-gate photosensors PS increases in the directions of x and y non-uniformly (for example, √2 times for 45°) in an oblique direction (at a suitable angle other than 0°, 90°, 180°, and 270°, for example, in the direction of 45° or 60°) with respect to the directions of x and y corresponding to the matrix, which prevents the object put obliquely from being read uniformly with high accuracy.

(c) The difference in the reflection of the projected light due to regularities in the finger is sensed using carriers generated in the semiconductor layer 1 composed of a—Si excited when light of visual light region is incident. Since the top gate electrode TG for accumulating carriers intervenes between such a subject as a finger and the semiconductor layer 1, it has the property of reflecting the light from the subject and allowing light in the wavelength region exciting the semiconductor layer 1 to pass through. For this reason, such a transparent electrode as ITO (Indium-Tin-Oxide) has to be used. The top gate electrodes TG of the double-gate photosensors PS adjacent to each other in the direction of row (or the direction of x) are connected to each other via top gate lines TGL. The top gate lines TGL themselves are made of ITO in such a manner that they are formed integrally with the top gate electrodes TG. ITO has a higher resistivity than such metallic material as chromium widely used as a wiring layer, which causes the problem of tending to cause a delay in the propagation of signals.

To solve the high-resistance ITO problem, the wiring resistance is reduced by forming a top gate line TGL composed of a wider wiring layer and making the wiring cross-sectional area larger. Even a transparent electrode like ITO attenuates the amount of transmitting light, which causes a problem: when the electrode is made thicker carelessly, the light-receiving sensitivity decreases.

In the manufacturing processes of the individual component parts of double-gate photosensors, top gate lines TGL are formed at a relatively upper layer, after various wiring layers, including drain lines DL connecting the drain electrodes 3 of the double-gate photosensors PS arranged adjacent to each other in the direction of column (or the direction of y), source lines SL (or ground lines) connecting the source electrodes 2 of the double-gate photosensors PS arranged adjacent to each other in the direction of column, and bottom gate lines BGL connecting the bottom gate electrodes BG of the double-gate photosensors PS arranged adjacent to each other in the direction of row, have been formed in a stacked manner. Therefore, the top gate lines TGL are liable to be influenced by steps in the stacked structure, which causes a problem: there is a strong possibility that the wires will break.

Furthermore, since the top gate lines TGL overlap with the bottom gate lines BGL between the double-gate photosensors PS adjacent to each other in the direction of row, the overlap capacitance between the top gate lines TGL and the bottom gate lines BGL introduces the problem of being more liable to cause a delay.

Accordingly, a first object of the present invention is to provide a photosensor system which improves the deviation of the light sensing area and has high-transistor-sensitivity photosensors and photosensors arranged therein to achieve a well-balanced light-receiving range.

A second object of the present invention is to provide a photosensor system which solves the aforementioned problems and can be driven properly, while suppressing a delay in the signal.

BRIEF SUMMARY OF THE INVENTION

To achieve the first object, a photosensor according to the present invention includes one or more semiconductor layers having carrier generating regions for generating carriers when being struck by exciting light or channel regions in which drain current flows. As a result, the positions of the carrier generating regions can be set arbitrarily in such a manner that the balance of incident light in the direction of two-dimensional travel is equalized. This enables sensing with less distortion and provides a large drain current, achieving a good transistor sensitivity. When carrier generating regions are provided in the direction of the channel length of the drain region, this brings particularly good results.

Furthermore, a delta arrangement of such photosensors equalizes further the distance between photosensors adjacent to each other two-dimensionally. This suppresses a shift in the optical information due to non-uniformity of the light-receiving sensitivity differing with the direction, when the same subject is placed on the photosensor array at a different angle in a plane. As a result, there are fewer limits to the angle at which the subject is placed, which helps realize a photosensor system with a far better image reading characteristic.

To accomplish the second object, a photosensor system includes a first gate line connecting the first gate electrodes of photosensors to each other and a second gate line connecting the second gate electrodes of the photosensors and arranged apart from the first gate line in a plane between the adjacent photosensors, thereby eliminating a parasitic capacitance between the first gate line and second gate line, which suppresses noise in the signal outputted to the first and second gate lines. Therefore, even if the number of photosensors connected to the first and second gate lines is very large, the system can operate properly. In addition, the voltage of the signal can be made relatively low, which reduces the power consumption. Moreover, branching the second gate line into plural lines produces the following effect: when the second late lines are formed at relatively higher layers in the stacked structure of the photosensor array, even if one second gate line has been broken due to steps, the signal can be supplied because the other second gate line compensates for the braking. This not only improves the yield in manufacture but also increases the cross-sectional area of the gate line wires to decrease the wiring resistance, thereby suppressing a delay in the propagation of the signal, which achieves a good subject image reading operation.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 10 is a schematic circuit diagram showing the resetting operation of the double-gate photosensor;

FIG. 11 is a schematic circuit diagram showing the light-sensing operation of the double-gate photosensor;

FIG. 12 is a schematic circuit diagram showing the precharging operation of the double-gate photosensor;

FIG. 13 is a schematic circuit diagram showing the operation of the double-gate photosensor in a selection mode in the bright state;

FIG. 14 is a schematic circuit diagram showing the operation of the double-gate photosensor in the selection mode in the dark state;

FIG. 15 is a schematic circuit diagram showing the operation of the double-gate photosensor in a non-selection mode in the bright state;

FIG. 16 is a schematic circuit diagram showing the operation of the double-gate photosensor in the non-selection mode in the dark state;

DETAILED DESCRIPTION OF THE INVENTION

Hereinafter, embodiments of a photosensor, a photosensor array, and a photosensor system related to the present invention will be explained in detail.

Referring to the accompanying drawings, a double-gate photosensor applied to an image reading device according to the present invention will be explained.

Figure 1:
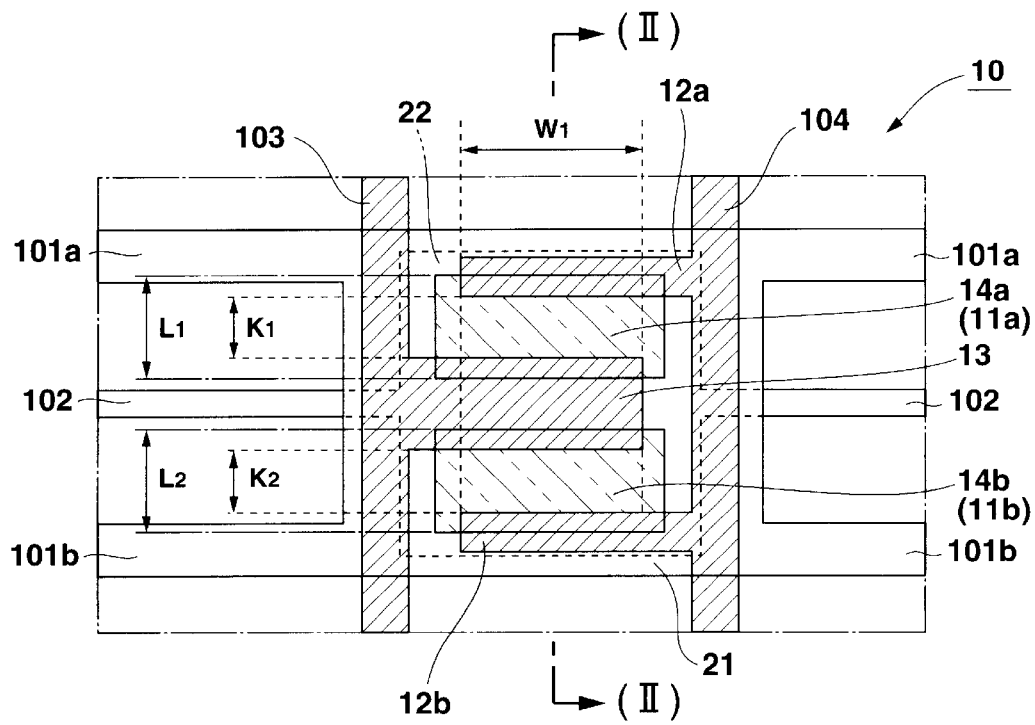
FIG. 1 is a plan view showing the structure of a double-gate photosensor applied to the present invention.
Figure 2:
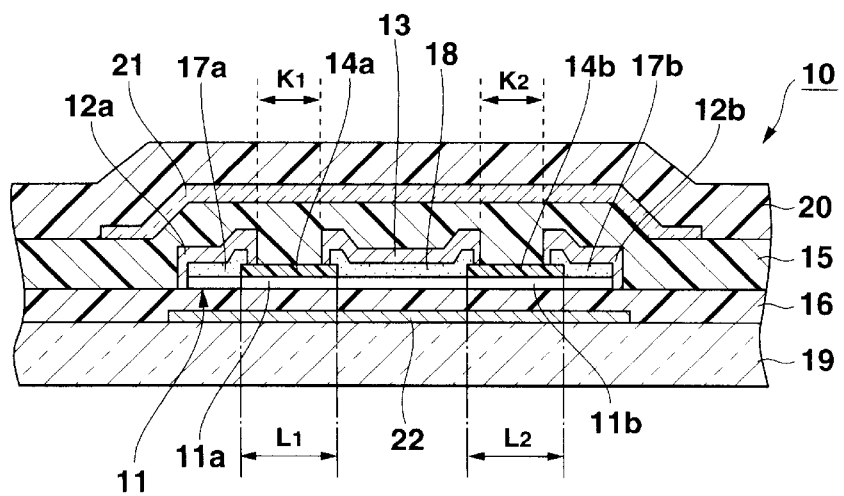
FIG. 2 is a sectional view taken along line II—II of FIG. 1.

FIG. 1 is a schematic plan view showing a double-gate photosensor 10 applied to a photosensor array according to the present invention. FIG. 2 is a sectional view taken along line II—II of FIG. 1. A concrete explanation will be given using a schematic configuration of a double-gate photosensor 10 which has a semiconductor layer acting as a photosensor section for each element and two divided channel regions of the semiconductor layer.

The double-gate photosensor 10 according to the present embodiment comprises a single opaque bottom gate electrode 22 formed on an insulating substrate 19 that allows visible light to pass through, a bottom gate insulating film 16 provided on the bottom gate electrode 22 and insulating substrate 19, a semiconductor layer 11 made of amorphous silicon or the like that is provided on the insulating film 16 so as to face the bottom gate electrode 22 and generates electron-hole pairs when being struck by visible light, block insulating films 14a, 14b arranged apart in parallel on the semiconductor layer, impurity doped layers 17a, 17b provided on both ends of the semiconductor layer 11 in the direction of channel length, an impurity doped layer 18 provided on the central part of the semiconductor layer 11 apart from the impurity doped layers 17a, 17b, source electrodes 12a, 12b provided on the impurity doped layers 17a, 17b, respectively, a drain electrode 13 provided on the impurity doped layer 18, a top gate insulating film 15 formed so as to cover the bottom gate insulating film 16, block insulating films 14a, 14b, source electrodes 12a, 12b, and drain electrode 13, a single top gate electrode 21 provided on the top gate insulating film 15 facing the semiconductor layer 11, and a protective insulating film 20 provided on the top gate insulating film 15 and top gate electrode 21.

Figure 3:
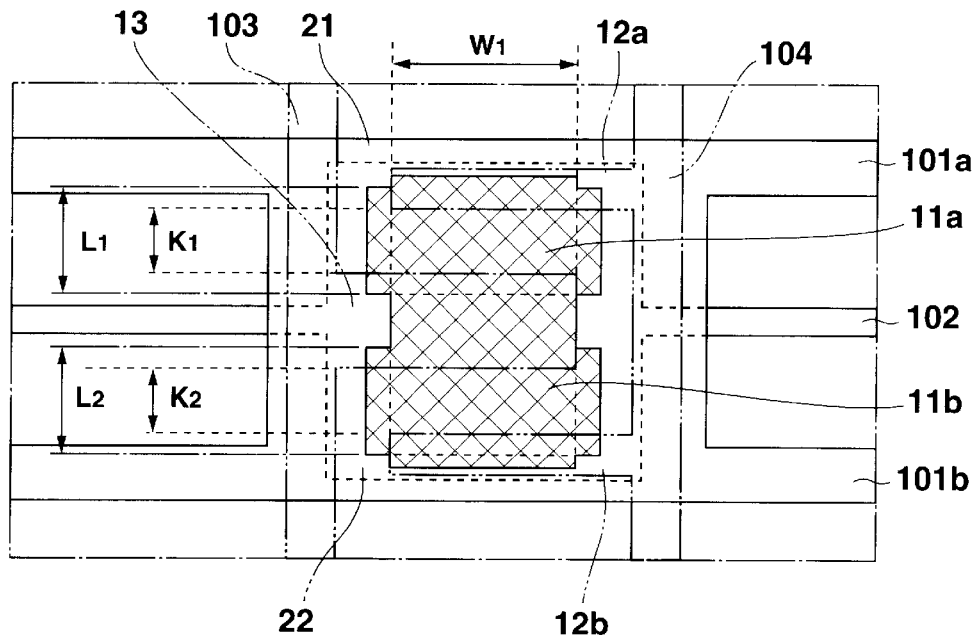
FIG. 3 is a plan view showing the position of a semiconductor layer.

As shown in FIG. 3, the semiconductor layer 11 is formed in the hatched area and includes a portion overlapping with the source electrodes 12a, 12b and drain electrode 13 in a plane and channel regions 11a, 11b overlapping with the block insulating films 14a, 14b in a plane. The channel regions 11a, 11b are arranged in parallel in the direction of channel length (in the direction of y).

Figure 4:
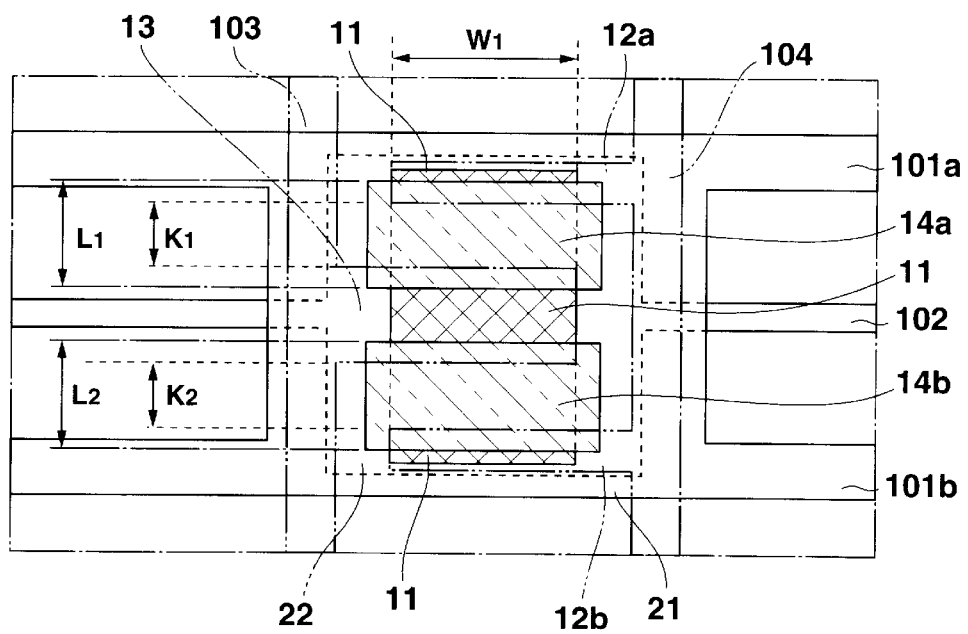
FIG. 4 is a plan view showing the relative positions of the semiconductor layer and a block insulating film.

As shown in FIG. 4, one block insulating film 14a is so located that the source electrode 12a and drain electrode 13 overlap both ends of the film 14a in a plane. The other block insulating film 14b is so located that the source electrode 12b and drain electrode 13 overlap both ends of the film 14b in a plane.

Figure 5:
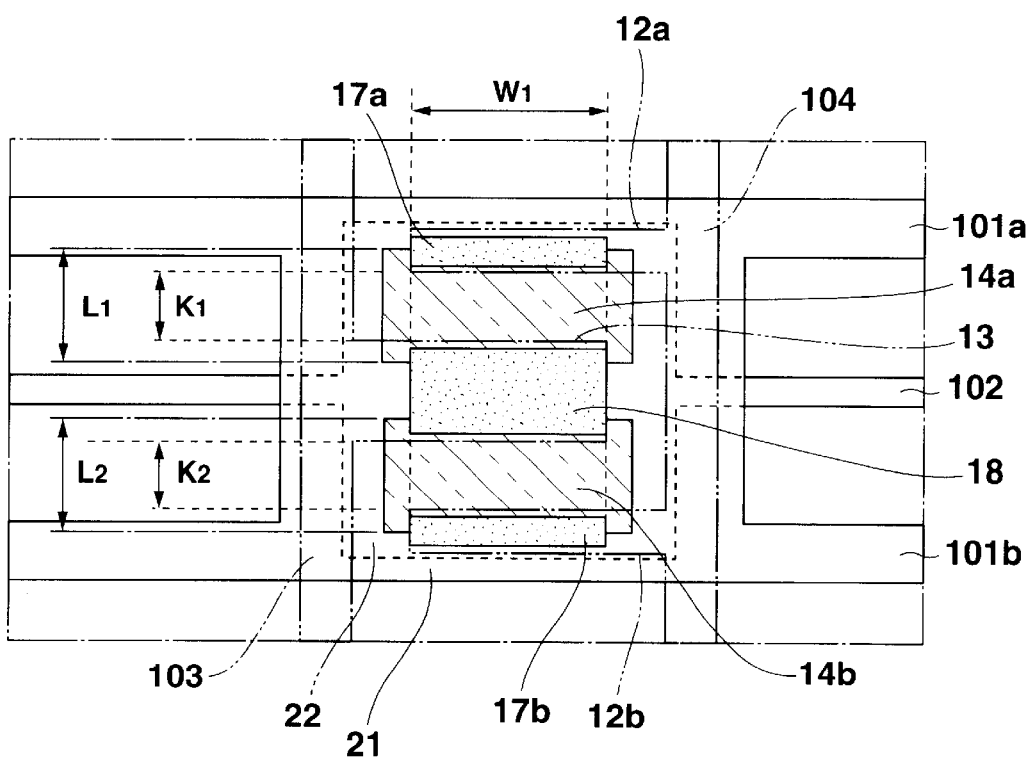
FIG. 5 is a plan view showing the relative positions of the block insulating film and an impurity doped layer.

As shown in FIG. 5, the impurity doped layers 17a, 17b, 18 are made of amorphous silicon (n$^+$ silicon) doped with n-type impurity ions. The impurity doped layer 17a intervenes between one end of the semiconductor layer 11 and the source electrode 12a. Part of the impurity doped layer 17a is located on the block insulating film 14a. The impurity doped layer 17b intervenes between the other end of the semiconductor layer 11 and the source electrode 12b. Part of the impurity doped layer 17b is located on the block insulating film 14b. The impurity doped layer 18 intervenes between the semiconductor layer 11 and the drain electrode 13. Both ends of the impurity doped layer 18 are located on the block insulating films 14a, 14b, respectively.

Figure 6:
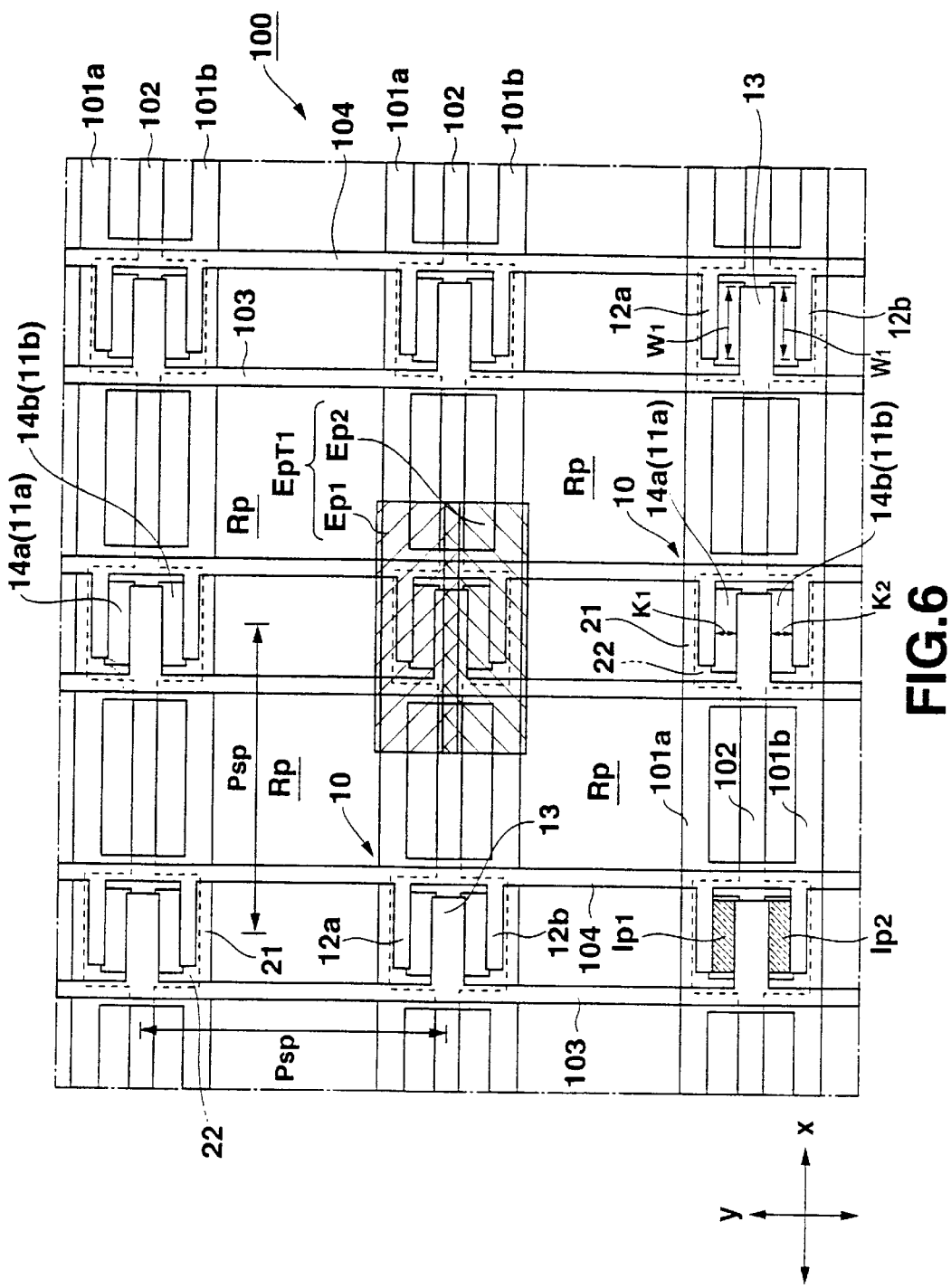
FIG. 6 is a plan view of a photosensor array composed of a two-dimensional arrangement of doublegate photosensors applied to the present invention.

FIG. 6 is a plan view showing the configuration of a photosensor array where a plurality of double-gate photosensors 10 are arranged in a matrix, each double-gate photosensor including two semiconductor layer regions per element serving as photosensors. The two semiconductor layer regions in the signal semiconductor layer 11 expose between the source electrode 12a, 12b and the drain electrodes 13. In the figure, the top gate electrodes 21 of the double-gate photosensors 10 arranged adjacent to each other in the direction of row are connected to two branched top gate lines 110a, 101b. The bottom gate electrodes 22 of the double-gate photosensors 10 arranged adjacent to each other in the direction of row are connected to a bottom gate line 102. The top gate lines 110a, 101b are placed between the double-gate photosensors 10 in such a manner that they do not overlap with the bottom gate line 102. The drain electrodes 13 of the double-gate photosensors 10 arranged adjacent to each other in the direction of column are connected to drain lines 103. The source electrodes 12 of the double-gate photosensors 10 arranged adjacent to each other in the direction of column are connected to source lines 104. A voltage Vss is supplied to the source lines 104.

The source electrodes 12a, 12b are so formed that they project in a comb-tooth like manner in the direction of x from the common source line 104 toward the drain line 103. The drain electrode 13 is so formed that it projects in the direction of x from the drain line 103 facing the source line 104 toward the source line 104. Specifically, the source electrode 12a and drain electrode 13 are so positioned that they face each other with the region. 11a of the semiconductor layer 11 between them. The source electrode 12b and drain electrode 13 are so positioned that they face each other with the region 11b of the semiconductor layer 11 between them.

In FIG. 2, the protective insulating film 20 provided on the block insulating films 14a, 14b, top gate insulating film 15, bottom gate insulating film 16, and top gate electrode 21 is made of an insulating film transparent for visible light, such as silicon nitride. The top gate electrode 21 and top gate lines 101a, 101b are made of light-transmitting conductive material, such as the aforementioned ITO, and present a high transmittance to visible light. On the other hand, the source electrodes 12a, 12b, drain electrode 13, bottom gate electrode 22, and bottom gate line 102 are made of material that prevents visible light from passing through and is selected from chromium, chrome alloy, aluminum, aluminum alloy, and the like.

Specifically, the double-gate photosensor 10 comprises a first double-gate photosensor composed of a first upper MOS transistor made up of the channel region 11a in the semiconductor layer 11, source electrode 12a, drain electrode 13, top gate insulating film 15, and top gate electrode 21, and a first lower MOS transistor made up of the channel region 11a, source electrode 12a, drain electrode 13, bottom gate insulating film 16, and bottom gate electrode 22 and a second double-gate photosensor composed of a second upper MOS transistor made up of the channel region 11b in the semiconductor layer 11, source electrode 12b, drain electrode 13, top gate insulating film 15, and top gate electrode 21 and a second lower MOS transistor made up of the channel region 11b, source electrode 12b, drain electrode 13, bottom gate insulating film 16, and bottom gate electrode 22, with the first and second double-gate photosensors arranged in parallel on the insulating substrate 19.

In the double-gate photosensor 10, the channel region 11a in which the drain current of the first double-gate photosensor flows is set as a rectangular shape whose two adjacent sides are defined by a channel length of $L_1$ and a channel width of $W_1$. The channel region 11b in which the drain current of the second double-gate photosensor flows is set as a rectangular shape whose two adjacent sides are defined by a channel length of $L_2$ and a channel width of $W_1$.

The carrier generating region on which light coming from above the double-gate photosensor 10 is incident and which has an effect on the drain current Ids of the first double-gate photosensor takes the form of a near rectangle with a length of about $K_1$ and a width of $W_1$ and closely resembles the shape of the channel region 11a. The carrier generating region on which the light coming from above the double-gate photosensor 10 is incident and which has an effect on the drain current Ids of the second double-gate photosensor takes the form of a near rectangle with a length of about $K_2$ and a width of $W_1$ and closely resembles the shape of the channel region 11b.

The photosensor system composed of a two-dimensional arrangement of double-gate photosensors will be explained briefly by reference to the circuit diagram.

Figure 7:
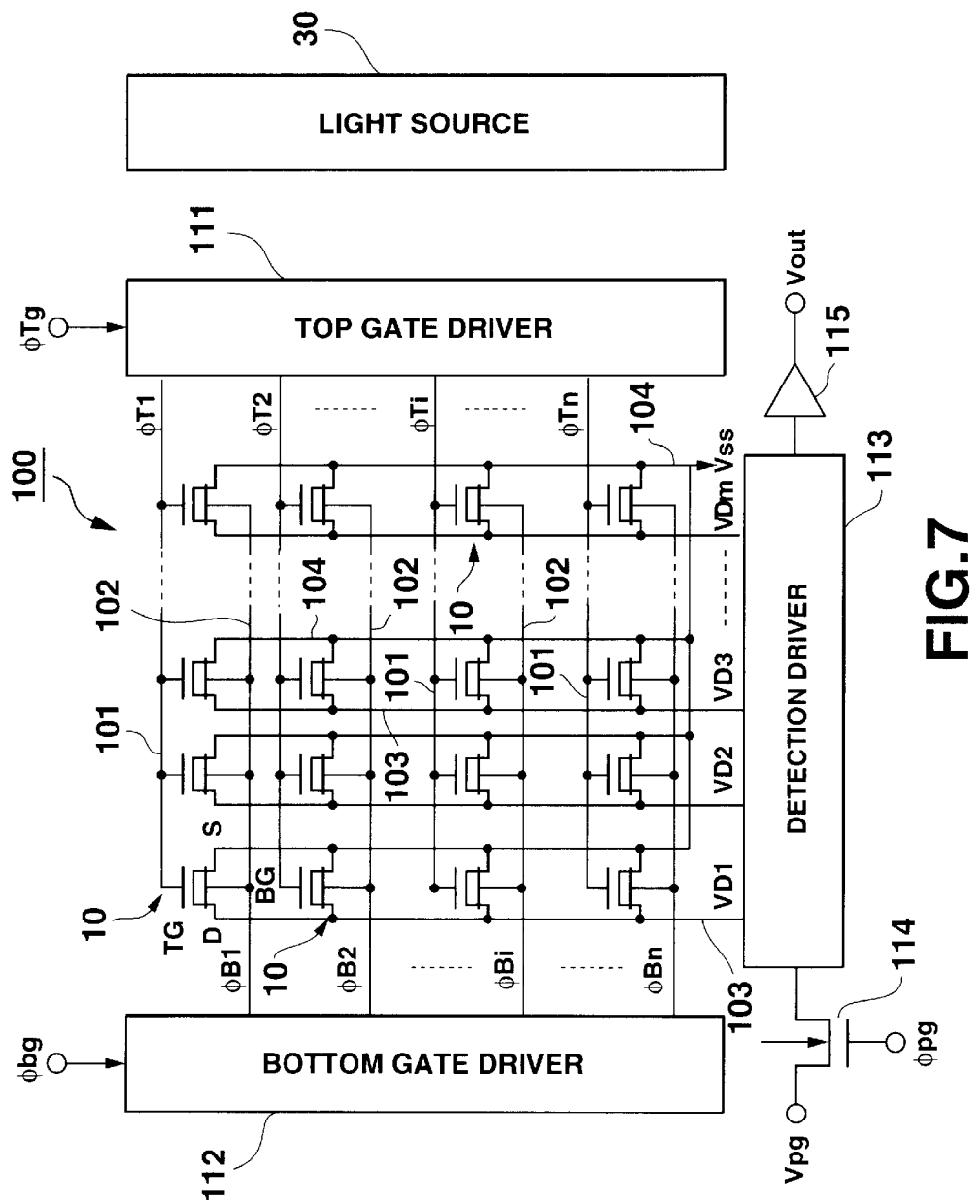
FIG. 7 is a schematic circuit diagram of a double-gate photosensor system applied to the present invention.

FIG. 7 schematically shows the configuration of the photosensor system composed of a two-dimensional arrangement of double-gate photosensors.

The photosensor sensor system roughly comprises a photosensor array 100 of many double-gate photosensors arranged in, for example, a matrix of n rows×m columns, top gate lines 101 (101a, 10b) and bottom gate lines 102 which connect the top gate terminals TG (top gate electrodes 21) and bottom gate terminals BG (bottom gate electrodes 22) of the double-gate photosensors 10 adjacent to each other in the direction of row, respectively, a top gate driver 111 and a bottom gate driver 112 connected to the top gate lines 101 and bottom gate line 102, respectively, drain lines 103 which connect the drain terminals D (drain electrodes 13) of the individual double-gate photo-sensors in the direction of column, a detection driver 113 connected to the drain lines 103, a switch 114, an amplifier circuit 115, source lines 104 which connect the source terminals S (source electrodes 12a, 12b) in the direction of column and to which a voltage of Vss is supplied, and a plane light source 30 below the photosensors 10. Although the voltage Vss has only to differ from the voltage precharged on the drain lines, it is desirable that the voltage Vss should be the ground potential.

The top gate lines 101, together with the top gate electrodes 21, are made of ITO. The bottom gate lines 102, drain lines 103, and source lines 104 are made of the same material of the bottom gate electrodes 22, drain electrodes 13, and source electrodes 12a, 12b in such a manner that they are integrally formed with the latter. Here, φtg is the control signals for generating reset pulses and accumulation pulses φT1, φT2, . . . , φTi, . . . , φTn. Mark φbg is the control signals for generating read pulses and non-read pulses φB1, φB2, . . . , φBi, . . . , φBn. And φpg is the precharging signal for controlling the timing of applying a precharge voltage Vpg.

With this configuration, the top gate driver 111 applies a voltage to the top gate terminal TG, thereby realizing a photosensing function. The bottom gate driver 112 applies a voltage to the bottom gate terminal BG, causing the detection driver 113 to take in the sense signal via the drain line 103 and output serial data or parallel data $V_{out}$, which realizes a selective reading function.

Next, a method of controlling the driving of the photosensor system will be described by reference to the accompanying drawings.

Figure 8:
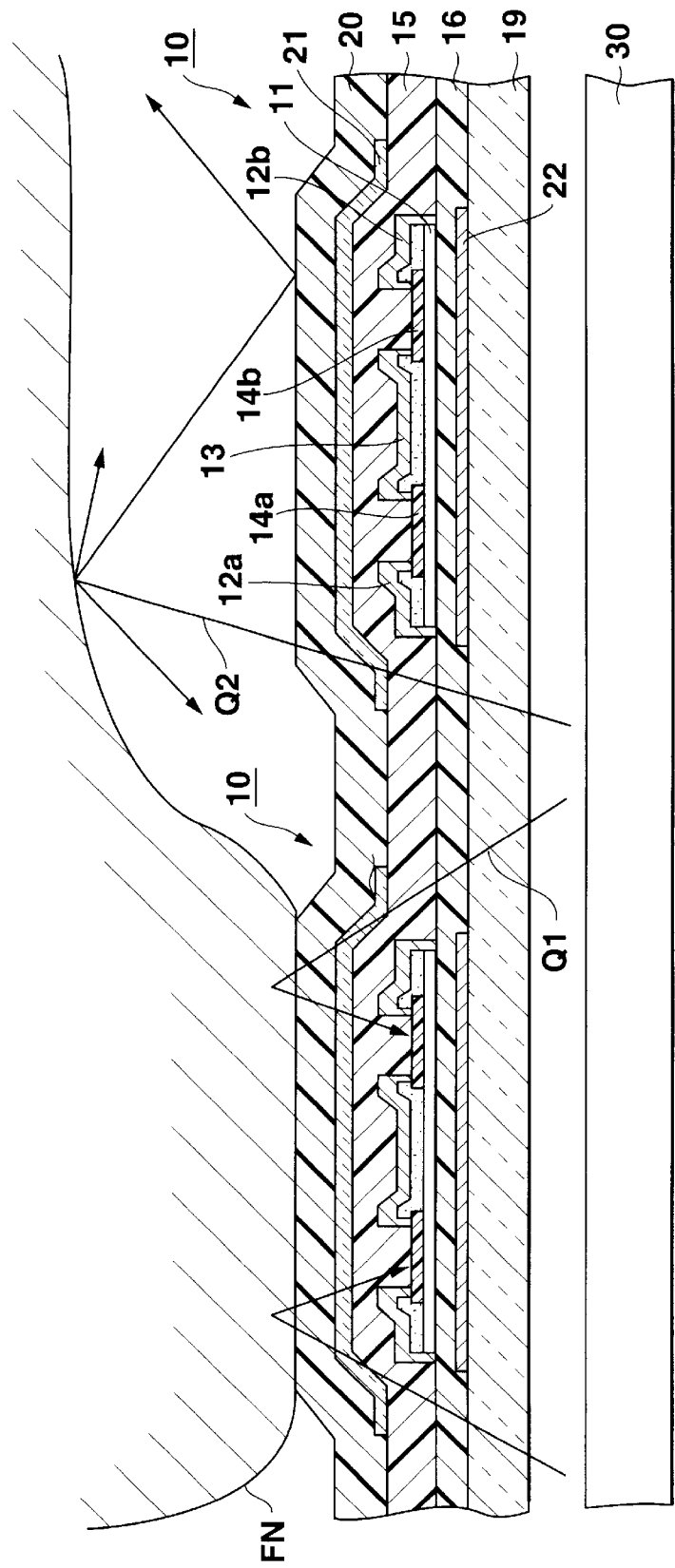
FIG. 8 is a sectional view showing a state where a finger is put on the photosensor system.
Figure 9:
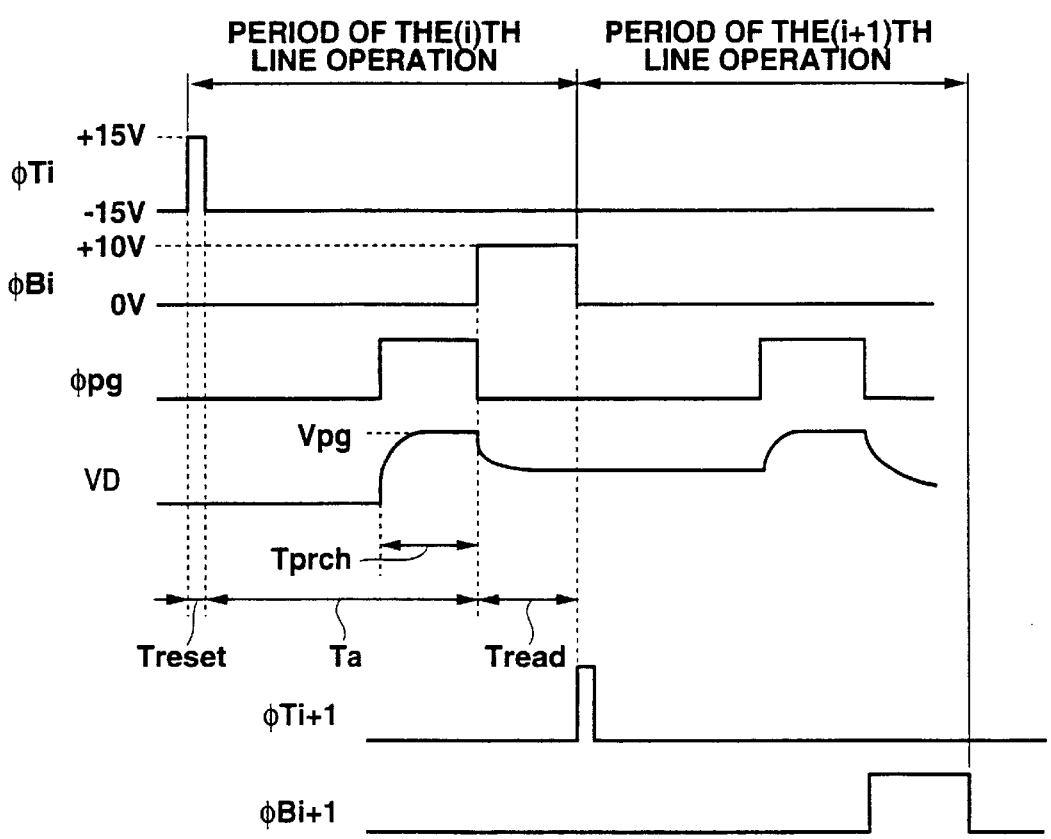
FIG. 9 is a timing chart showing an example of a method of controlling the driving of the photosensor system.
Figure 17:
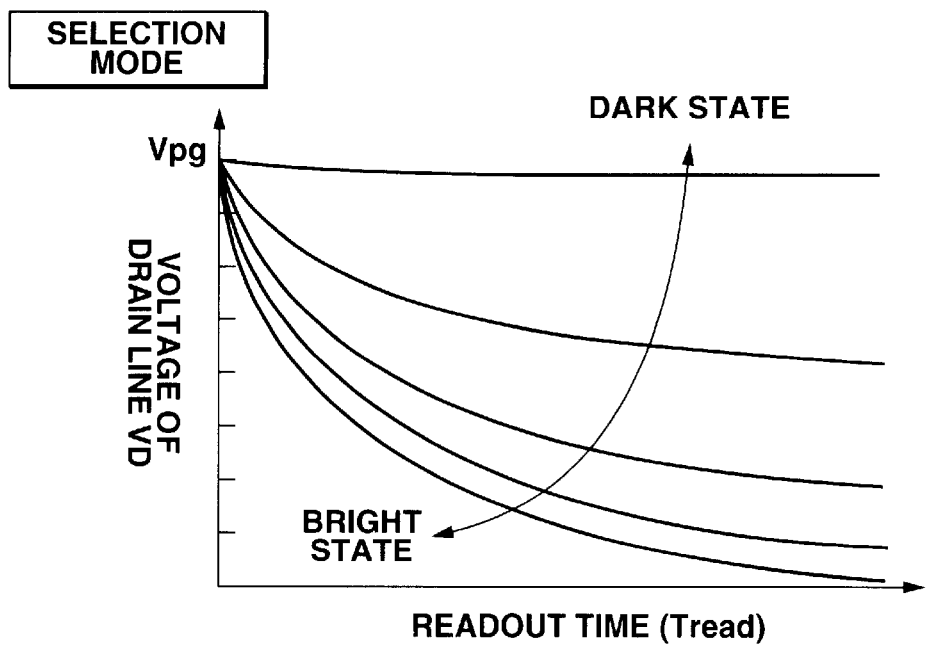
FIG. 17 is a graph showing a drain voltage characteristic of the double-gate photosensor in the selection mode.
Figure 18:
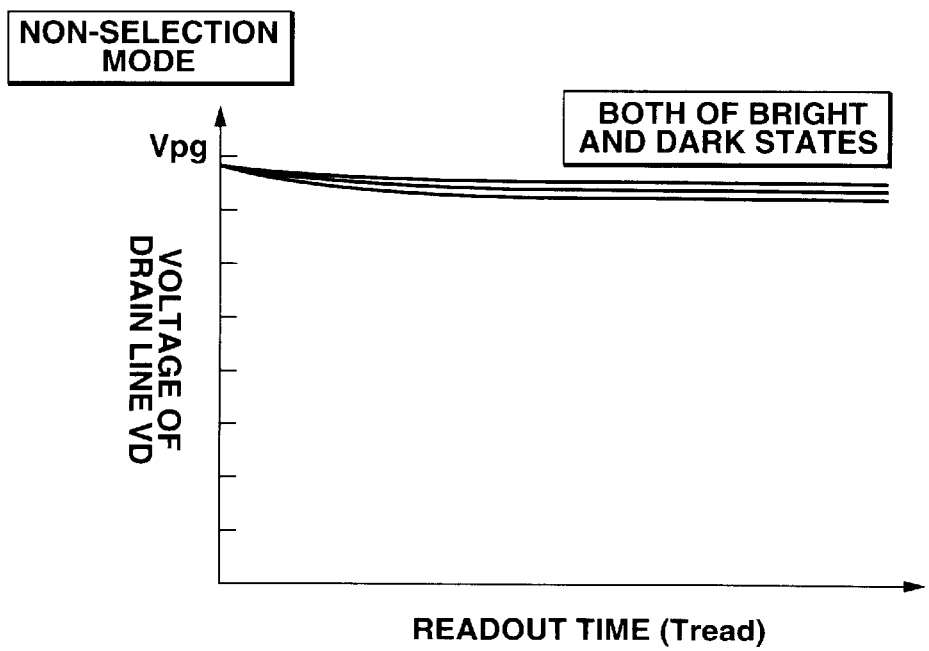
FIG. 18 is a graph showing a drain voltage characteristic of the double-gate photosensor in the non-selection mode.

FIG. 8 is a sectional view showing a state where a finger is put on the photosensor system 100. FIG. 9 is a timing chart to help explain an example of a method of controlling the driving of the photosensor system 100. FIGS. 10 to 16 show conceptual diagrams of the operation of the double-gate photosensor 10. FIGS. 17 and 18 show optical response characteristics of the output voltage of the photosensor system.

First, as shown in FIG. 8, a finger FN is put on the protective insulating film 20 of the photosensor system 100. At this time, while the projecting parts defining the finger-print of the finger FN directly touch the protective insulating film 20, the grooves between the projecting parts do not touch the protective insulating film 20, with air intervening between the finger and the film 20. When the finger FN is placed on the insulating film 20, the photosensor system 100 applies signal (reset pulse as high as, for example, Vtg=+15V) φTi to the top gate line 101 at the i-th row and the non-read signal φBi of 0V to the bottom gate line 102 at the i-th row, thereby performing the reset operation of discharging (in a reset period of Treset) the carriers (here, holes) accumulated the semiconductor layer 11 and the block insulating film 14.

The light in the wavelength range including visible light from the plane light source 30 provided below the glass substrate 19 of the double-gate photosensors 10 is emitted toward the double-gate photosensors 10 side.

At this time, since the opaque bottom gate electrode 22 intervenes between the plane light source 30 and semiconductor layer 11, the emitted light hardly enters the semiconductor layer 11 directly, but the light passed through the transparent insulating substrate 19 and insulating films 15, 16, 20 in the element-to-element region Rp is projected on the finger FN on the protective insulating film 20. Of the light projected on the finger FN, light Q1 projected at an angle smaller than the critical angle of total reflection is reflected irregularly at the interface between the projecting parts of the finger FN and the protective insulating film 20 or at the inside of the epidermis of the finger FN. The reflected light is caused to enter the semiconductor layer 11 of the closest double-gate photosensor 10 via the insulating films 15, 10 and top gate electrode 21. The refractive indices of the insulating films 15, 16, 20 are set to about 1.8 to 2.0 and the refractive index of the top gate electrode 21 is set to about 2.0 to 2.2. In contrast, in the grooves of the finger FN, while light Q2 is being reflected irregularly in the grooves, it attenuates in the air, preventing a sufficient amount of light from entering the semiconductor layer 11 of the closest double-gate photosensor 10.

Specifically, the amount of carriers that can be generated and accumulated in the semiconductor layer 11 varies according to the amount of reflected light entering the semiconductor layer 11 according to the fingerprint pattern of the finger FN.

Next, shown in FIGS. 9 and 11, the photosensor system 100 applies a bias voltage of φTi of low level (e.g., Vtg=−15V) to the top gate line 101, after the reset operation, and performs a carrier accumulating operation, starting a carrier accumulating period Ta in the carrier accumulating operation.

In the carrier accumulating period Ta, electron-hole pairs are generated in the semiconductor layer 11 according to the amount of light entering from the top gate electrode 21 side. The holes are accumulated in the semiconductor layer 11 and the vicinity of the interface between the semiconductor layer 11 and the block insulating film 14, that is, in the channel region and the vicinity of the channel region.

In the precharging operation, as shown in FIGS. 9 and 12, the switch 114 is turned on the basis of the precharging signal φpg in parallel with the carrier accumulating period Ta and a specific voltage (precharge voltage) of Vpg is applied to the drain lines 103, thereby causing the drain electrodes 13 to retain charges (precharging period Tprch).

Then, in a read operation, as shown in FIGS. 9 and 13, after the precharging period Tprch has elapsed, a bias voltage (read select signal, hereinafter, referred to as read pulse) of φBi of a high-level (e.g., Vbg=+10V) is applied to the bottom gate line or the bottom gate lines 102 in the row in the selection mode, thereby bringing the double-gate photosensors in the row in the selection mode into the ON state (read period Tread).

In the read period Tread, since the carriers (holes) accumulated in the channel region serve to alleviate Vtg (−15V) of the opposite polarity applied to the top gate terminal TG, Vbg at the bottom gate terminal BG forms an n⁻ channel and the drain line voltage VD on the drain line 103 tends to decrease from the precharge voltage Vpg gradually according to the drain current as time passes as shown in FIG. 17.

Specifically, when the carrier accumulated state in the carrier accumulating period Ta is in the dark state and no carrier (hole) has been accumulated in the channel region, applying a negative bias to the top gate TG cancels the positive bias at the bottom gate BG for forming the n⁻ channel as shown in FIGS. 14 and 17, bringing the double-gate photosensor 10 into the OFF state, which causes the drain voltage, or the voltage VD on the drain line 103, to remain unchanged.

On the other hand, when the carrier accumulated state is in the bright state, since carries (holes) have been captured in the channel region according to the amount of incident light as shown in FIGS. 13 and 17, the carriers serve to cancel the negative bias at the top gate TG. The positive bias at the bottom gate BG corresponding to the amount of the negative bias canceled forms an n⁻ channel, bringing the double-gate photosensor 10 into the ON state, which causes the drain current to flow. Then, on the basis of the drain current flowing according to the amount of incident light, the voltage VD on the drain line 103 drops.

Therefore, as shown in FIG. 17, the tendency of the voltage VD on the drain line 103 to vary is closely related to the amount of light received during the time (carrier accumulating time Ta) from when the reset operation has ended as a result of the application of the reset pulse φTi to the top gate TG until read pulse φBi has been applied to the bottom gate BG. When the number of accumulated carries is small, the voltage VD tends to decrease gently. When the number of accumulated carriers is large, the voltage VD tends to drop sharply. Therefore, when the read period Tread starts, the amount of projected light is calculated by sensing the voltage VD on the drain line 103 after a specific time has elapsed, or by sensing the time required to reach the voltage using a specific threshold voltage as a reference.

On the assumption that the aforementioned series of image reading operations is one cycle, applying equivalent processing procedures repeatedly to the double-gate photosensors 10 in the (i+1)th row enables the double-gate photosensors 10 to operate as a two-dimensional sensor system.

In the timing chart shown in FIG. 9, when the low level (e.g., Vbg=0V) is kept applied to the bottom gate line 102 in the non-selection mode after the precharge period Tprch has elapsed as shown in FIGS. 15 and 16, the double-gate photosensor 10 remains in the OFF state and the voltage VD on the drain line 103 keeps the precharge voltage Vpg as shown in FIG. 18 even if the photosensor 11 in the bright state. In this way, the state where the voltage is applied to the bottom gate line 102 realizes the function of selecting the reading state of the double-gate photosensor 10. The precharge voltage VD on the drain line 103 attenuated according to the amount of light is read again into the detection driver 113, passes through the amplifier circuit 115, and is supplied as a signal of voltage $V_{out}$ in the form of a serial or parallel output to a pattern authentication circuit.

Here, how the shape of the virtual incident region (effective incident region) of the exciting light on the channel regions 11a, 11b of a photosensor of the invention composed of a double-gate photosensor 10 including the aforementioned two channel regions 11a and 11b is related to the transistor sensitivity of the double-gate photosensor will be explained in detail.

In the double-gate photosensor, the drain current Ids flowing according to the amount of light is proportional to (channel width W)/(channel length L).

Since in the double-gate photosensor 10, the channel length of the first double-gate photosensor is set to $L_1$ and its channel width is set to $W_1$ and the channel length of the second double-gate photosensor is set to $L_2$ and its channel width is set to $W_1$, the drain current Ids flowing through a single double-gate photosensor 10 is expressed by the following expression (2):

$$Ids \propto (W_1/L_1 + W_1/L_2) \quad (2)$$

Here, if $L_2=L_1$, then expression (2) becomes the following expression (3):

$$Ids \propto 2W_1/L_1 \quad (3)$$

Figure 30:
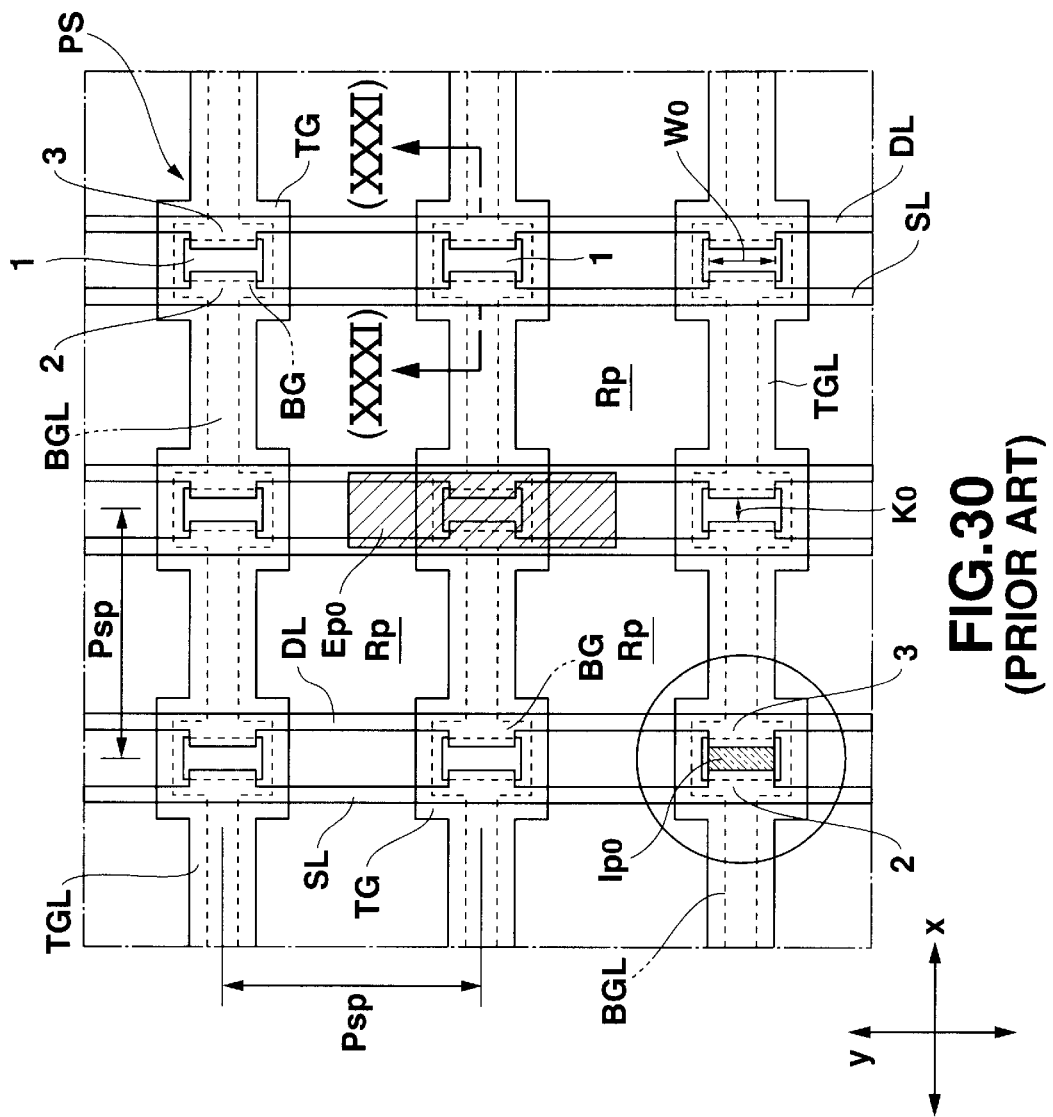
FIG. 30 is a plan view of an array where conventional double-gate photosensors are arranged.
Figure 31:
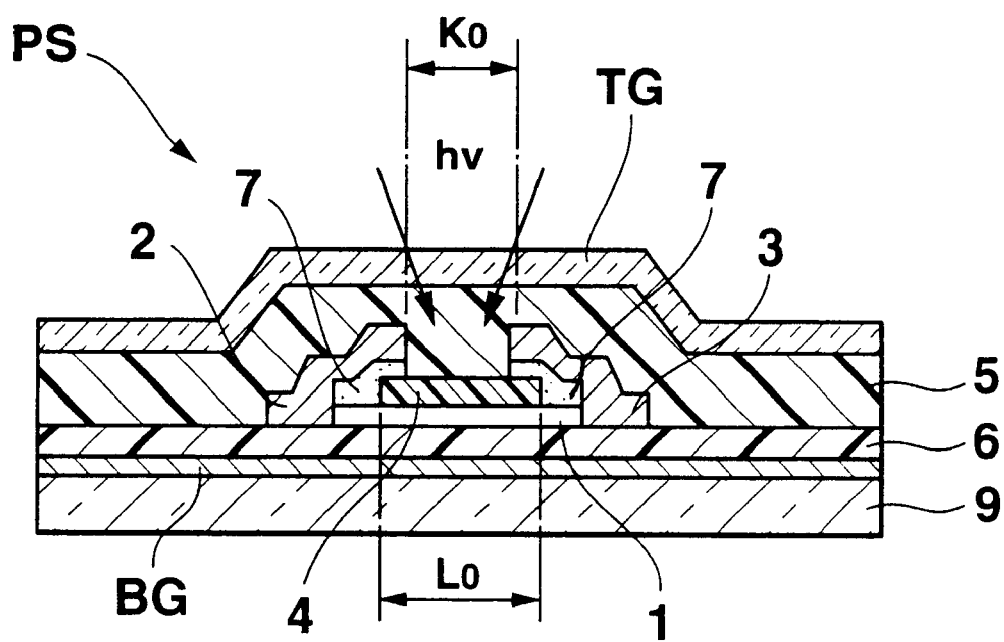
FIG. 31 is a sectional view taken along line XXXI—XXXI of FIG. 30, showing the structure of a double-gate photosensor.

Then, if the ratio $(W_1/L_1)$ is made equal to the ratio $(W_0/L_0)$ of a double-gate photosensor PS with the conventional structure shown in FIG. 30, the drain current Ids of a double-gate photosensor 10 of the invention is twice as large as the drain current Ids of the double-gate photosensor PS, lowering the precharge voltage in the bright state sufficiently, which enables even a subject in a low contrast ratio between the bright state and the dark state to be sensed sufficiently.

As described above, since the source-drain current value Ids in the double-gate photosensor 10 depends on the sum of a ratio of (channel width $W_1$)/(channel length $L_1$) of the channel region 11a and a ratio of (channel width $W_1$)/(channel length $L_2$) of the channel region 11b, an improvement in the drain current of the double-gate photosensor 10 requires the value $(W_1/L_1+W_1/L_2)$ to be made as large as possible. For the double-gate photosensor 10 to read a sufficient difference between the incident light in the bright state and that in the dark state (or a difference in the precharged drain voltage), it is desirable that both the ratio $W_1/W_1$ and $W_1/L_2$ should be 1.5 or more. It is more desirable that they should be 3.5 or more.

In the double-gate photosensor 10, since the source electrodes 12a, 12b and drain electrode 13 are opaque to visible light, the carrier generating region $Ip_1$ where such holes are generated as have an effect on the drain current Ids in the channel region 11a of the first double-gate photosensor of the double-gate photosensor 10 closely resembles a near rectangle with a longitudinal length of about $K_1$ and a lateral length equal to the channel width $W_1$, and the carrier generating region $Ip_2$ where such holes are generated as have an effect on the drain current Ids in the channel region 11b of the second double-gate photosensor of the double-gate photosensor 10 closely resembles a near rectangle with a longitudinal length of about $K_2$ and a lateral length equal to the channel width $W_1$.

Since the carrier generating region $Ip_1$ and carrier generating region $Ip_2$ are arranged in parallel in the direction of channel length, as shown in FIG. 6, on the protective insulating film 20, at least either the light sensible region $Ep_1$ (the region shaded with slated lines in the figure) through which the light caused to enter the carrier generating region $Ip_1$ as a result of reflection from the finger at the surface of the protective insulating film 20 passes or the light sensible region $EP_2$ (the region shaded with slated lines in the figure)

through which the light caused to enter the carrier generating region Ip$_2$ as a result of reflection from the finger at the surface of the protective insulating film 20 passes, that is, the region E$_{PT1}$ a single double-gate photosensor can sense, is shaped more like a regular square. The sensible regions schematically illustrate the regions assuring a specific light-receiving sensitivity, centered on the channel regions 11a, 11b, but not represent the distribution range of light-receiving sensitivity accurately.

As a result, the sensible region Ep$_1$ and sensible region EP$_2$ of the double-gate photosensor 10 of the invention are such that the balance between the sensible region for light traveling in the direction of x and the sensible region for light traveling in the direction of y is equalized more than the sensible region Ep$_0$ of a conventional double-gate photosensor PS, which suppresses distortions in reading two-dimensional images.

As described above, because the ratio (W$_1$/W$_1$+W$_1$/L$_2$) can be set higher and the double-gate photosensor 10 has a good sensitivity, even if the contrast ratio between the bright state and the dark state is low, clearly distinguishable data V$_{out}$ can be outputted. At the same time, because the carrier generating region Ip$_1$ and carrier generating region Ip$_2$ are arranged in parallel in the direction in which the distance of light sensitivity is shorter (the direction of y), this improves the plane balance of the sensing range of the light caused to enter the semiconductor layer 11 at an angle of 45° from right to left with the direction of y in the middle, enabling the fingerprint of the finger FN to be authenticated with high accuracy.

The plane structure of the photosensor array composed of such double-gate photosensors is so designed that double-gate photosensors 10 are arranged in a lattice (or matrix) with a specific pitch of Psp in the two directions of x and y (the directions of row and column) perpendicular to each other and that the light from the plane light source 30 is projected on the subject through the element-to-element region Rp in the lattice. For this reason, to project a sufficient amount of light on the subject, it is desirable that the element-to-element region Rp should be made as large as possible.

The more the sensible region E$_{PT1}$ resembles a regular square, the more the variation in the light-receiving sensitivity caused by the incident angle of exciting light entering the channel regions 11a, 11b is corrected. Specifically, the sensitivity of light entering the channel regions 11a, 11b from the region with an angle of 45° above and 45° below the center line extending in the direction of x is made more equal to the sensitivity of light entering the channel regions 11a, 11b from the region with an angle of 45° to the right and to the left of the center line extending in the direction of x. This corrects the variation (directivity) in the light-receiving sensitivity, which provides a sensible region E$_{PT1}$ whose light-sensing region expand almost uniformly in the directions of x and y (to take the form of a rectangle closer to an almost regular square).

Therefore, such double-gate photosensors 10 are arranged in a matrix to construct a photosensor array 100 as shown in FIG. 6, thereby equalizing the expanse. in the direction of the sensible region E$_{PT1}$, which realizes a photosensor array with a high light-receiving sensitivity light-receiving section and a photosensor system, while suppressing distortion in reading two-dimensional images. At this time, because the top gate lines 101a, 101b connecting the top gate electrodes 21 of the double-gate photosensors 10 are arranged and formed in such a manner that they are branched in a plane and positioned uniformly (symmetrically) in the direction of y, the exciting light reflected by the subject, passing through the top gate lines 101a, 101b, and entering the channel regions 11a, 11b attenuates uniformly, which prevents the incident light from having an effect on the variation in the light-receiving sensitivity as compared with a case where wider top gate lines are arranged and formed in offset positions. This assures the uniform expanse of the light sensing region accurately and prevents distortion in reading two-dimensional images.

Furthermore, with the double-gate photosensor 10, because the light-receiving sensitivity is increased remarkably, even if the amount of incident light is small, the light-and-shade information can be read properly, as compared with a conventional double-gate photosensor PS. This helps reduce the illuminance of the plane light source provided for the reading device, decreasing the power consumption of the two-dimensional image reading device. When the illuminance of the plane light source is made constant, an improvement in the light-receiving sensitivity shortens the carrier accumulating time remarkably, which provides a reading device excellent in the two-dimensional image reading performance.

Furthermore, the remarkably improved light-receiving sensitivity permits excessive light-on current to be generated for the same amount of incident light as in a double-gate photosensor 10. To suppress such an on current, the operation is controlled by lowering the driving voltage applied to both electrodes of the top and bottom gates. Thus, the decrease of the driving voltage suppresses the deterioration of the characteristic of the double-gate photosensor with time, which enables the reliability of the photosensor array to last long.

In the photosensor array 100 of FIG. 6, the two top gate lines 110a, 101b connect the top gate electrodes 21 of the double-gate photosensors arranged in each row. The bottom gate line 102 connects the bottom gate electrodes 22 of the double-gate photosensors 10 arranged in each row. The top gate lines 101a, 101b in the same row are so formed that they are branched in a plane between the adjacent double-gate photosensors 10 and extend in parallel, while keeping the uniform positional relationship and an equal wire width and thickness. Specifically, the top gate lines 101a, 101b are arranged and formed almost symmetrically in the direction of column above and below the bottom gate line 102 extending in such a manner that it connects almost the middle of the double-gate photosensor 10. That is, the top gate line 101a and top gate line 101b basically form an axial-symmetric structure with the bottom gate line 102 in the direction of x as an axis. This equalizes the balance between the amount of the light attenuated by passing through the top gate line 101a and top gate line 101b and caused to enter at the top gate line 101a side (top side) and the amount of the light caused to enter at the top gate line 101b side (lower side). In contrast, the source line 104 side and drain line 103 side basically form an axial-symmetric structure with the line extending from the center of the semiconductor layer 11 in the direction of y as an axis. When the light attenuated by passing through the top gate line 101a and top gate line 101b is caused to enter the semiconductor layer 11, the balance between incidence on the right side and left side of the photosensor 10 can be equalized. Since the top gate lines are so branched that the incidence balance of light become equal vertically and horizontally, the balance of the directivity of light sensed can be improved. In addition, because the top gate lines 101a, 101b arranged between the adjacent photosensors 10 hardly overlap with the bottom gate line 102 vertically, there is almost no parasitic capacitance between the top gate lines 110a, 101b and the bottom gate line 102, suppressing a delay in the signal or a drop in the voltage.

With such a configuration, since the top gate electrodes 21 are basically connected by two wiring layers, when the cross-sectional area per wiring layer is the same, the cross-sectional area of the wiring is almost doubled as compared with use of a single wiring layer. This halves the wiring resistance of the top gate lines 101a, 101b made of ITO of high resistivity, suppressing a delay in the read operation signal, which realizes the operation of reading far better images.

In the stacked structure of a double-gate photosensor as shown in FIG. 2, since the top gate lines at a relatively upper layer are made of two wiring layers (101a, 101b), even if one top gate line (for example, 101a) has broken due to steps more prominent at a higher layer in the stacked structure or due to particles, such as dust, acting as obstacles in the photolithographic processing, the other top gate line (for example, 101b) enables the top gate electrodes 21 to be connected to each other electrically, compensating for the propagation of the read operation signal, which provides a highly reliable photosensor array.

While in the present embodiment, the top gate line has been branched in two lines, the present invention is not limited this. The top gate line may be branched into more than two lines. The wiring layer to be branched is not restricted to the top gate line. In short, it goes without saying that the present invention is applicable to a wiring layer of higher wiring resistance than that of another wiring layer (for example, metal wires) applied to the photosensor array and photosensor system.

Figure 19:
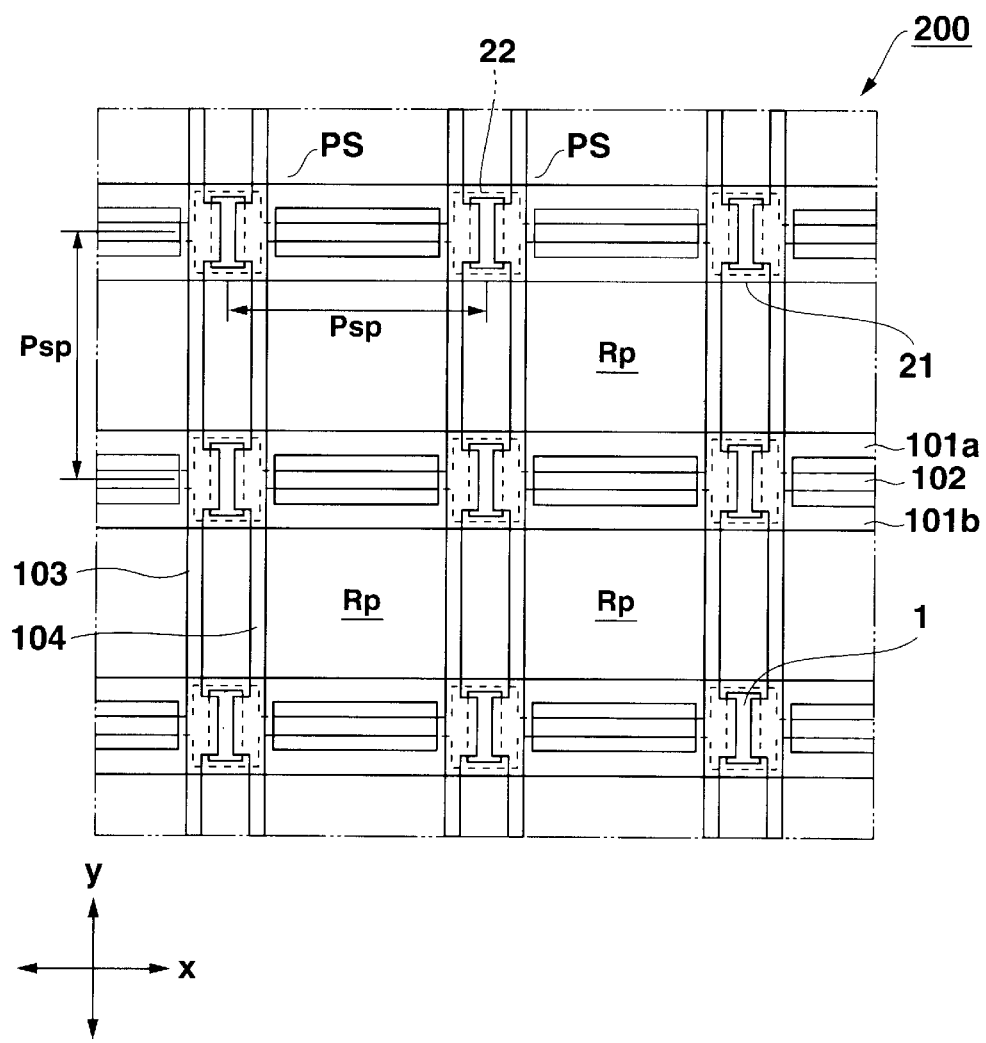
FIG. 19 is a plan view showing the structure that suppresses the parasitic capacitance between the top gate lines and bottom gate lines.

Even in the case of conventional double-gate photosensors, when a photosensor array 200 is such that the top gate lines 101a, 101b between double-gate photosensors PS are so arranged that they do not overlap with the bottom gate line 102 as shown in FIG. 19, it produces such effects as suppressing parasitic capacitance and preventing the breaking of wires. A photosensor system provided with the photosensor 200 is such that the photosensor array 100 is replaced with the photosensor array 200.

In the double-gate photosensor 10, one element is composed of one semiconductor layer. A photosensor array composed of a single double-gate photosensor 50 with plural semiconductor layers and a photosensor system will be explained by reference to the accompanying drawings. The double-gate photosensor 50 in the embodiment explained below realizes a photosensing function by the same driving and produces the same effect.

Figure 20:
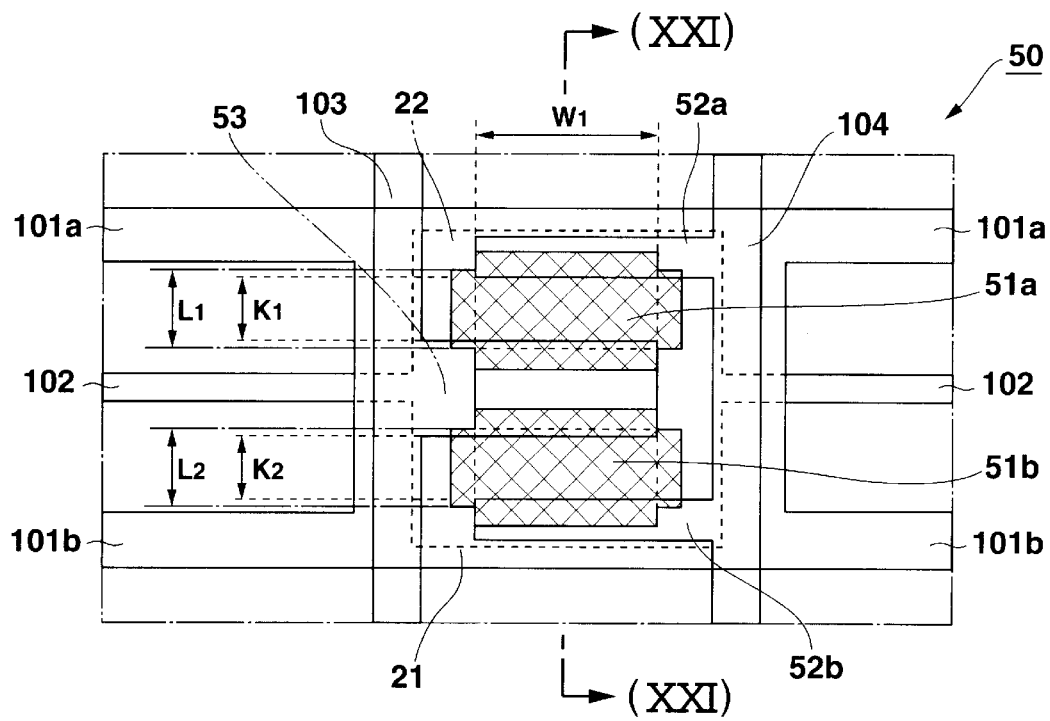
FIG. 20 is a plan view showing the structure of a double-gate photosensor provided with two semiconductor layers.

FIG. 20 schematically shows the configuration of a double-gate photosensor 50 applied to a photosensor array according to the present invention. A concrete explanation will be given using a schematic configuration of a double-gate photosensor provided with two semiconductor layers per element serving as a photosensor section.

Figure 21:
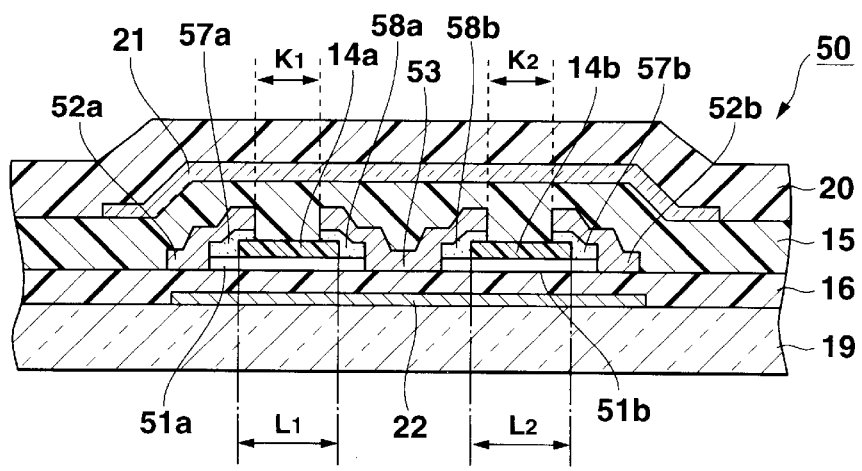
FIG. 21 is a sectional view taken along line XXI—XXI of FIG. 20.

FIG. 21 is a sectional view taken along line XXI—XXI of FIG. 20. The double-gate photosensor 50 according to the present embodiment comprises an opaque bottom gate electrode 22 formed on an insulating substrate 19 that allows visible light to pass through, a bottom gate insulating film 16 provided on the bottom gate electrode 22 and insulating substrate 19, two semiconductor layers 51a, 51b that are made of amorphous silicon or the like and generate electron-hole pairs by incident visible light and that are provided in such a manner that they are provided on the insulating film 16 to face the bottom gate electrode 22 and are separated from each other, block insulating films 14a, 14b arranged apart in parallel on the semiconductor layers 51a, 51b, impurity doped layers 57a and 58a provided at both ends of one semiconductor layer 51a, impurity doped layers 57b and 58b provided at both ends of the other semiconductor layer 51b, source electrodes 52a, 52b provided on the impurity doped layers 57a, 57b, respectively, a single drain electrode 53 formed so as to extend over the impurity doped layers 58a, 58b between the semiconductor layers 51a, 51b, a top gate insulating film 15 formed so as to cover the bottom gate electrode 16, block insulating films 14a, 14b, source electrodes 52a, 52b, and drain electrode 53, a single top gate electrode 21 provided on the top gate insulating film 15 facing the semiconductor layers 51a, 51b, and a protective insulating film 20 provided on the top gate insulating film 15 and top gate electrode 21.

The source electrodes 52a, 52b and drain electrode 53 overlapping both of ends of the semiconductor layers 51a 51b both of ends of the block insulating films 14a, 14b, and the impurity doped layers 57a, 57b, 58a, 58b in a plane. The impurity doped layers 57a, 57b, 58a, 58b overlapping with both of the ends of the block insulating films 14a, 14b in a plane. The impurity doped layers 57a, 57b, 58a, 58b are made of amorphous silicon (n$^+$ silicon) doped with n-type impurity ions.

As shown in FIG. 20, the source electrodes 52a, 52b are so formed that they project in a comb-tooth like manner in the longitudinal direction (from right to left in the figure) from the common source line 104 toward the semiconductor layers 51a, 51b. The drain electrode 53 is so formed that it projects in the direction of the channel width from the drain line 103 facing the source line 104 toward the semiconductor layers 51a, 51b. Specifically, these source electrodes 52a, 52b and drain electrode 53 are so formed in an incorporating manner that they face each other with the respective semiconductor layers 51a, 51b between them.

The protective insulating film 20 provided on the block insulating films 14a, 14b, top gate insulating film 15, bottom gate insulating film 16, and top gate electrode 21 is made of a light-transmitting insulating film, such as silicon nitride. The top gate electrode 21 and top gate lines 101a, 101b are made of light-transmitting conductive material, such as the aforementioned ITO, and present a high transmittance to visible light. On the other hand, at least the bottom gate electrode 22 and bottom gate line 102 are made of material that prevents light from passing through, such as chromium (Cr) or the like.

Specifically, the double-gate photosensor 10 comprises a first double-gate photosensor composed of a first upper MOS transistor made up of the semiconductor layer 51a, source electrode 52a, drain electrode 53, top gate insulating film 15, and top gate electrode 21 and a first lower MOS transistor made up of the semiconductor layer 51a, source 52a, drain electrode 53, bottom gate insulating film 16, and bottom gate electrode 22, and a second double-gate photosensor composed of a second upper MOS transistor made up of the semiconductor layer 51b, source electrode 52b, drain electrode 53, top gate insulating film 15, and top gate electrode 21 and a second lower MOS transistor made up of the semiconductor layer 51b, source electrode 52b, drain electrode 53, bottom gate insulating film 16, and bottom gate electrode 22, with the first and second double-gate photosensors arranged in parallel on the insulating substrate 19.

Because the double-gate photosensor 50 is so constructed that the top gate electrode 21 and bottom gate electrode 22 constituting the first and second double-gate photosensors are each made up of common electrodes and the source electrodes 52a, 52b are formed by the projections from the common source line 104, the double-gate photosensor 50 provided with two semiconductor layers per element serving as photosensor sections can be operated by the above-described driving control method.

In the semiconductor layer 51a, the channel region in which the drain current of the first double-gate photosensor in the double-gate photosensor 50 flows is set as a rectangular shape whose two adjacent sides are defined by a channel length of $L_1$ and a channel width of $W_1$. In the semiconductor layer 51b, the channel region in which the drain current of the second doublegate photosensor flows is set as a rectangular shape whose two adjacent sides are defined by a channel length of $L_2$ and a channel width of $W_1$.

The drain current Ids flowing in the double-gate photosensor 50 is represented by the following expression (4):

$$Ids \propto (W_1/W_1 + W_1/L_2) \tag{4}$$

Figure 22:
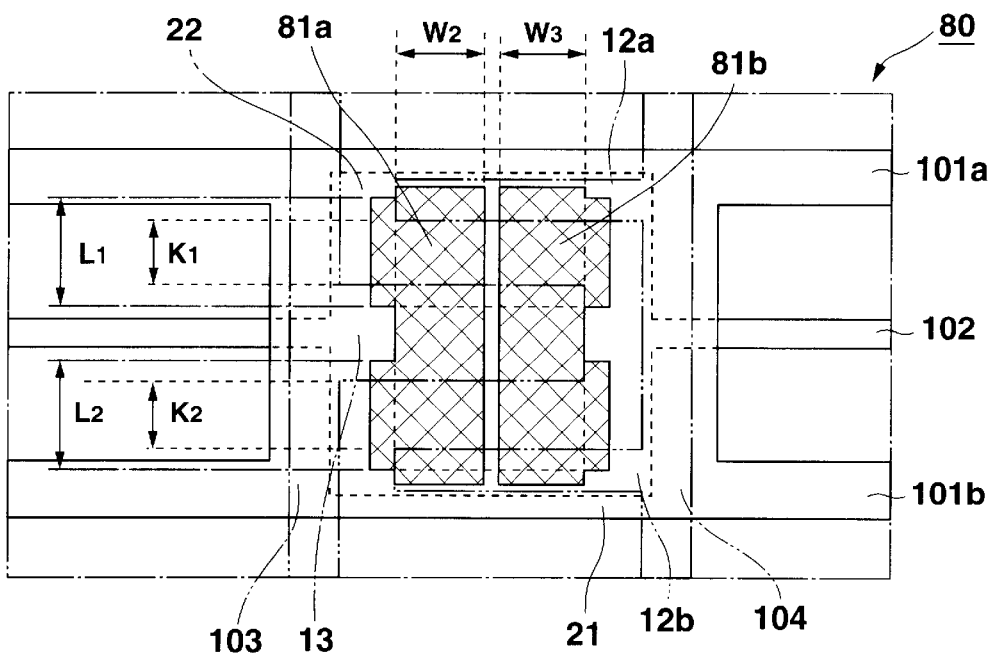
FIG. 22 is a plan view showing the structure of a double-gate photosensor which is provided with two semiconductor layers and has four channel regions and four carrier generating regions.

While in the double-gate photosensor 50, one carrier generating region and a channel region in which the drain current flows are provided in one semiconductor layer 51a (51b), a double-gate photosensor 80 including semiconductor layers 81a, 81b may be used as shown in FIG. 22. The double-gate photosensor 80 has substantially the same configuration as that of the double-gate photosensor 10 except for the semiconductor layers 81a, 81b and produces a similar effect.

In the double-gate photosensor 80, the channel region of the semiconductor layer 81a is set as a rectangular region whose two adjacent sides are defined by a channel length of $L_1$ and a channel width of $W_2$ and as a rectangular region whose two adjacent sides are defined by a channel length of $L_2$ and a channel width of $W_2$. The channel region of the semiconductor layer 81b is set as a rectangular region whose two adjacent sides are defined by a channel length of $L_1$ and a channel width of $W_3$ and as a rectangular region whose two adjacent sides are defined by a channel length of $L_2$ and a channel width of $W_3$.

The carrier generating region which causes such holes as have an effect on the drain current Ids in the channel region of the double-gate photosensor 80 is set as a rectangular region whose two adjacent sides are defined by the distance $K_1$ between the source and drain electrodes and the channel width $W_2$, as a rectangular region whose two adjacent sides are defined by the distance $K_2$ between the source and drain electrodes and the channel width $W_2$, as a rectangular region whose two adjacent sides are defined by the distance $K_1$ between the source and drain electrodes and the channel width $W_3$, and as a rectangular region whose two adjacent sides are defined by the distance $K_2$ between the source and drain electrodes and the channel width $W_3$.

The drain current Ids flowing in the double-gate photosensor 80 is represented by the following expression (5):

$$Ids \propto (W_2/L_1 + W_3/L_1 + W_2/L_2 + W_3/L_2) \tag{5}$$

Figure 23:
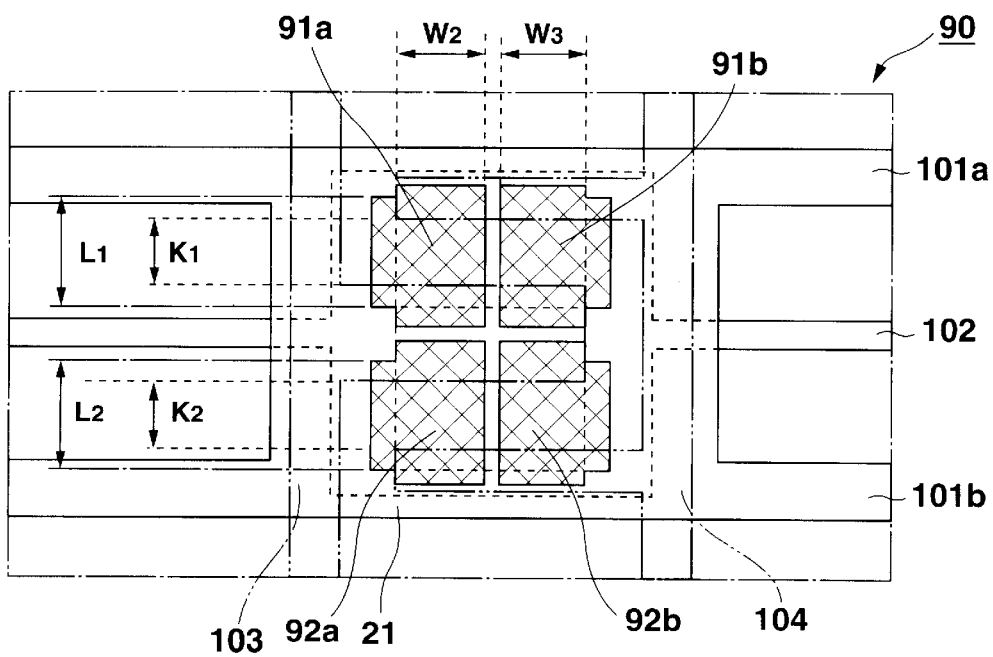
FIG. 23 is a plan view showing the structure of a double-gate photosensor which is provided with four semiconductor layers and has four channel regions and four carrier generating regions.

As shown in FIG. 23, a double-gate photosensor 90 including semiconductor layers 91a, 91b, 92a, 92b may be used. The double-gate photosensor 90 has substantially the same configuration as that of the double-gate photosensor 10 except for the semiconductor layers 91a, 91b, 92a, 92b and produces a similar effect.

In the double-gate photosensor 90, the channel region of the semiconductor layer 91a is set as a rectangular region whose two adjacent sides are defined by a channel length of $L_1$ and a channel width of $W_2$. The channel region of the semiconductor layer 91b is set as a rectangular region whose two adjacent sides are defined by a channel length of $L_1$ and a channel width of $W_3$. The channel region of the semiconductor layer 92a is set as a rectangular region whose two adjacent sides are defined by a channel length of $L_2$ and a channel width of $W_2$. The channel region of the semiconductor layer 92b is set as a rectangular region whose two adjacent sides are defined by a channel length of $L_2$ and a channel width of $W_3$.

The carrier generating region which causes such holes as have an effect on the drain current Ids in the channel regions of the semiconductor layers 91a, 91b, 92a, 92b in the double-gate photosensor 90 is set as a rectangular region whose two adjacent sides are defined by the distance $K_1$ between the source and drain electrodes and the channel width $W_2$, as a rectangular region whose two adjacent sides are defined by the distance $K_1$ between the source and drain electrodes and the channel width $W_3$, as a rectangular region whose two adjacent sides are defined by the distance $K_2$ between the source and drain electrodes and the channel width $W_2$, and as a rectangular region whose two adjacent sides are defined by the distance $K_2$ between the source and drain electrodes and the channel width $W_3$.

The drain current Ids flowing in the double-gate photosensor 90 is represented by the following expression (6):

$$Ids \propto (W_2/L_1 + W_3/L_1 + W_2/L_2 + W_3/L_2) \tag{6}$$

Figure 24:
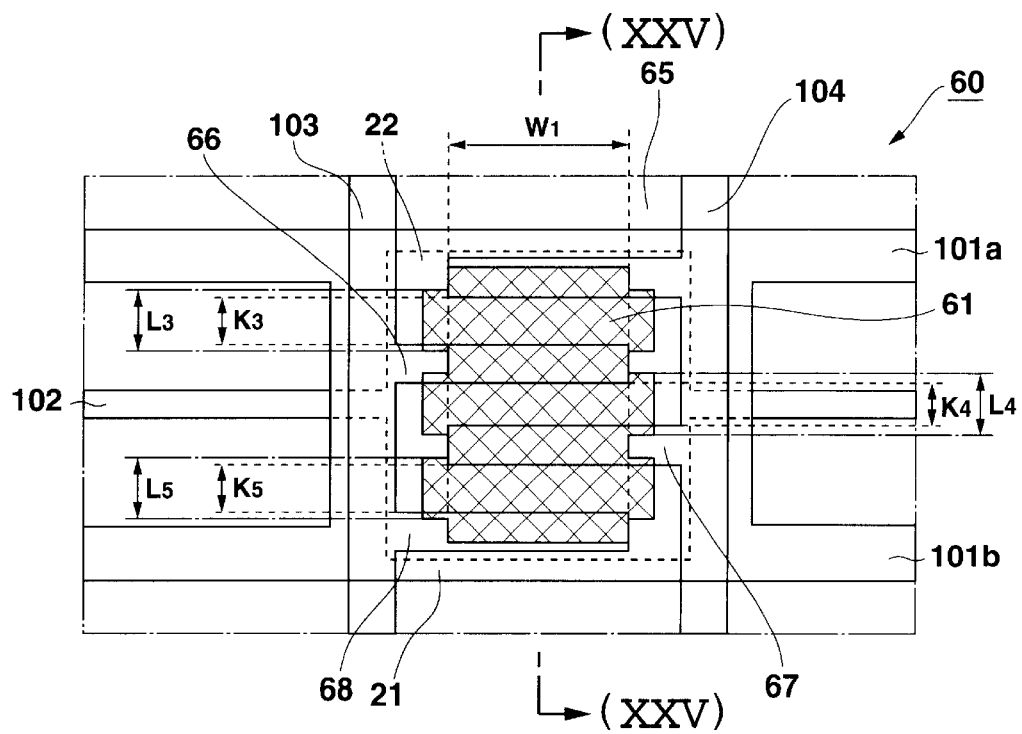
FIG. 24 is a plan view showing the structure of a double-gate photosensor which is provided with a single semiconductor layer and has three channel regions and three carrier generating regions.
Figure 25:
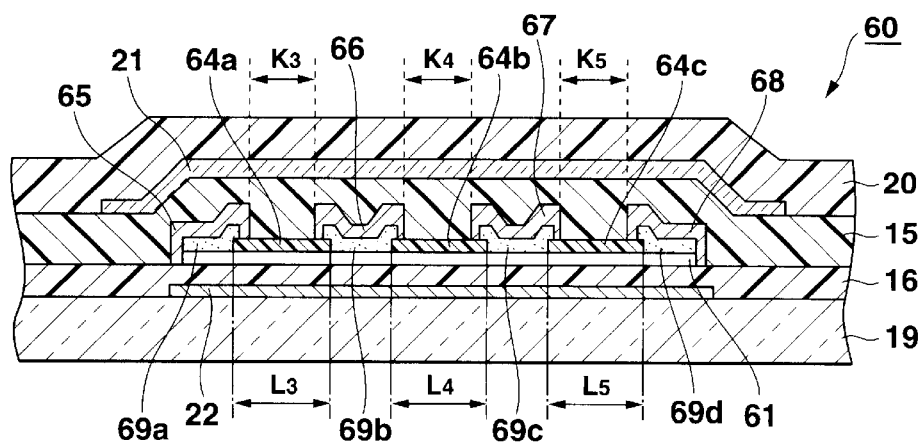
FIG. 25 is a sectional view taken along line XXV—XXV of FIG. 24.
Figure 26:
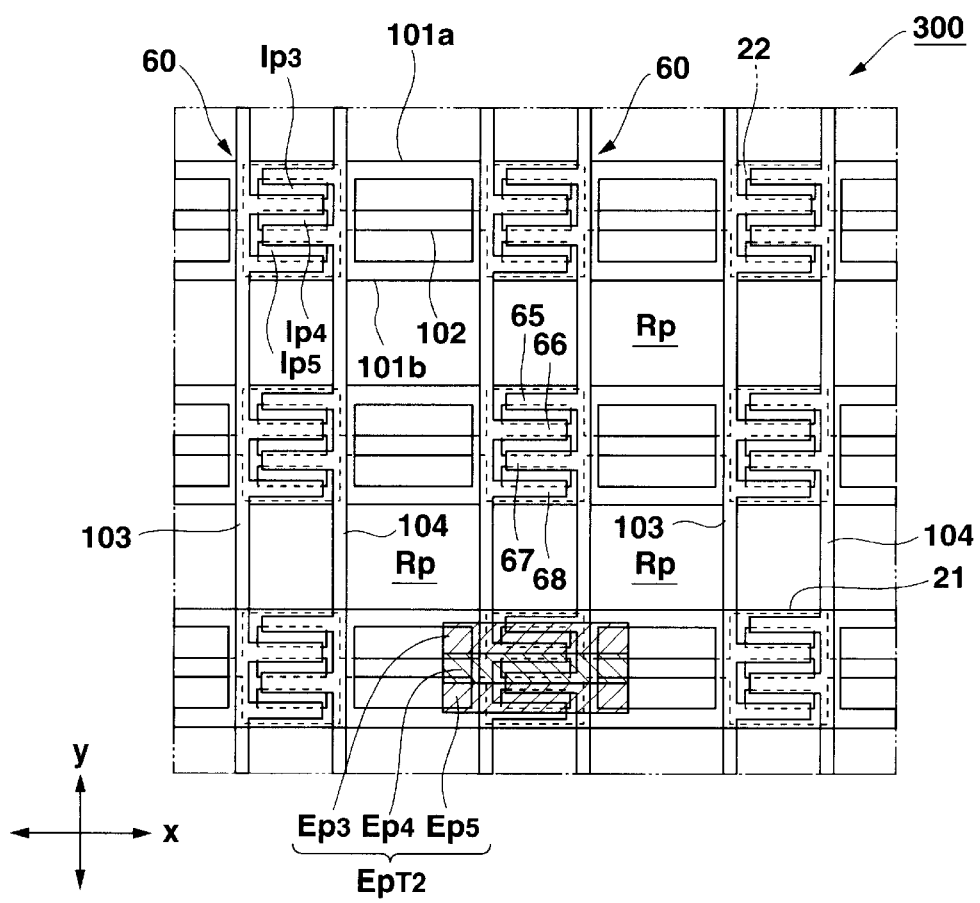
FIG. 26 is a plan view of a photosensor array where double-gate photosensors are arranged in a matrix, each double-gate photosensor being provided with a single semiconductor layer and having three channel regions and three carrier generating regions.

FIG. 24 schematically shows the configuration of another double-gate photosensor 60 applied to the photosensor array according to the present invention. FIG. 25 is a sectional view taken along line XXV—XXV of FIG. 24. FIG. 26 is a plan view of a photosensor array where the double-gate photosensors 60 are arranged in a matrix. The same component parts as those of the above embodiment are indicated by the same reference symbols and explanation of them will be omitted.

The double-gate photosensor 60 comprises a single bottom gate electrode 22 formed on an insulating substrate 19 that allows visible light to pass through, a bottom gate insulating film 16 provided on the bottom gate electrode 22 and insulating substrate 19, a single semiconductor layer 61 made of amorphous silicon or the like that is provided so as to face the bottom gate electrode 22 and generates electron-hole pairs when being struck by visible light, block insulating films 64a, 64b, 64c arranged apart in parallel on the semiconductor layer 61, an impurity doped layer 69a that extends over one end of the block insulating film 64a in the direction of channel length and is provided on the semiconductor layer 61, an impurity doped layer 69b that extends over the other end of the block insulating film 64a in the direction of channel length and one end of the block insulating film 64b in the direction of channel length and is provided on the semiconductor layer 61, an impurity doped layer 69c that extends over the other end of the block insulating film 64b in the direction of channel length and one end of the block insulating film 64c in the direction of channel length and is provided on the semiconductor layer 61, an impurity doped layer 69d that extends over the other end of the block insulating film 64c in the direction of channel length and is provided on the semiconductor layer 61, and a source electrode 65, a drain electrode 66, a source electrode 67, and a drain electrode 68 which are provided on the impurity doped layer 69a, impurity doped layer 69b, impurity doped layer 69c, and impurity doped layer 69d, respectively, a top gate insulating film 15 formed so as to cover the bottom gate insulating film 16, block insulating films 64a, 64b, 64c, source electrodes 65, 67, and drain electrodes 66, 68, a single top gate electrode 21 provided on the top gate insulating film 15 facing the semiconductor layer 61, and a protective insulating film 20 provided on the top gate insulating film 15 and top gate electrode 21.

Because the materials of the individual insulating films and electrodes and the remaining configurations are the same as the materials of the corresponding members and configuration in the embodiment of FIGS. 2 and 6, explanation of them will be omitted. The impurity doped layers 69a, 69b, 69c, 69d are made of amorphous silicon (n$^+$-silicon) doped with n-type impurities.

The double-gate photosensor 60 is such that a first double-gate photosensor made up of the semiconductor layer 61, source electrode 65, drain electrode 66, top gate insulating film 15, bottom gate insulating film 16, top gate electrode 21, and bottom gate electrode 22, a second double-gate photosensor made up of the semiconductor layer 61, source electrode 67, drain electrode 66, top gate insulating film 15, bottom gate insulating film 16, top gate electrode 21, and bottom gate electrode 22, and a third double-gate photosensor made up of the semiconductor layer 61, source electrode 65, drain electrode 68, top gate insulating film 15, bottom gate insulating film 16, top gate electrode 21, and bottom gate electrode 22 are connected in parallel.

In the semiconductor layer 61, the channel region in which the drain current of the first double-gate photosensor in the double-gate photosensor 60 flows is set as a rectangular shape whose two adjacent sides are defined by a channel length of $L_3$ and a channel width of $W_1$. The channel region in which the drain current of the second double-gate photosensor flows is set as a rectangular shape whose two adjacent sides are defined by a channel length of $L_4$ and a channel width of $W_1$. The channel region in which the drain current of the third double-gate photosensor flows is set as a rectangular shape whose two adjacent sides are defined by a channel length of $L_5$ and a channel width of $W_1$.

Because the double-gate photosensor 60 is so constructed that the top gate electrode 21 and bottom gate electrode 22 constituting each of the first to third double-gate photosensors are each made up of common electrodes, the source electrodes 65, 67 are formed by the projections from the common source line 104, and the drain electrodes 66, 68 are formed by the projections from the common drain line 103, the three double-gate photosensors can be operated as a single double-gate photosensor by the above-described driving control method.

The drain current Ids flowing in the double-gate photosensor 60 is represented by the following expression (7):

$$Ids \propto (W_1/L_3 + W_1/L_4 + W_1/L_5) \quad (7)$$

With the double-gate photosensor 60 constructed as described above, the value $(W_1/L_3 + W_1/L_4 + W_1/L_5)$ of the semiconductor layer 61 constituting the channel region can be increased, enabling an increase in the drain current, which improves the transistor sensitivity of each double-gate photosensor 60 remarkably.

In the semiconductor layer 61, the carrier generating regions $Ip_3$, $Ip_4$, $Ip_5$ so exposed from the source and drain electrodes 65, 66, 67, 68 that light coming from above is allowed to enter the regions take the forms of a rectangle with a width of $W_1$ and a length of $K_3$, a rectangle with a width of $W_1$ and a length of $K_4$, and a rectangle with a width of $W_1$ and a length of $K_5$, respectively. This brings a synthetic shape of the light sensible regions $Ep_3$, $Ep_4$, $Ep_5$ closer to a regular square. The light caused by reflection from the finger FN at the surface of the protective insulating film 20 to enter each carrier generating region passes through the light sensible regions $Ep_3$, $Ep_4$, $Ep_5$.

In such a double-gate photbsensor 60, the top gate line 110a side and top gate line 101b side basically form an axial-symmetric structure with the bottom gate line 102 in the direction of x as an axis. The source line 104 side and drain line 103 side basically form an axial-symmetric structure with the line extending from the center of the semiconductor layer 61 in the direction of y as an axis. Furthermore, the semiconductor layer 61 basically forms a symmetric structure vertically and horizontally with respect to the center of the photosensor 60 and constitute a matrix-like photosensor array 300 where the distance from the center (the center of the semiconductor layer 61) to the end in the direction of x is made approximate to the distance from the center to the end in the direction of y. This equalizes the expanse of the light-sensing region more, suppressing distortions in reading two-dimensional images, which realizes a photosensor array and photosensor system provided with a light-receiving section with a higher light-receiving sensitivity. In addition, because the top gate lines 101a, 101b arranged between the adjacent photosensors 60 hardly overlap with the bottom gate line 102 vertically, there is almost no parasitic capacitance between the top gate lines 101a, 101b and the bottom gate line 102, suppressing a delay in the signal or a drop in the voltage. The photosensor system provided with the photosensor 300 is such that the photosensor array 100 of FIG. 7 is replaced with the photosensor 300.

Figure 27:
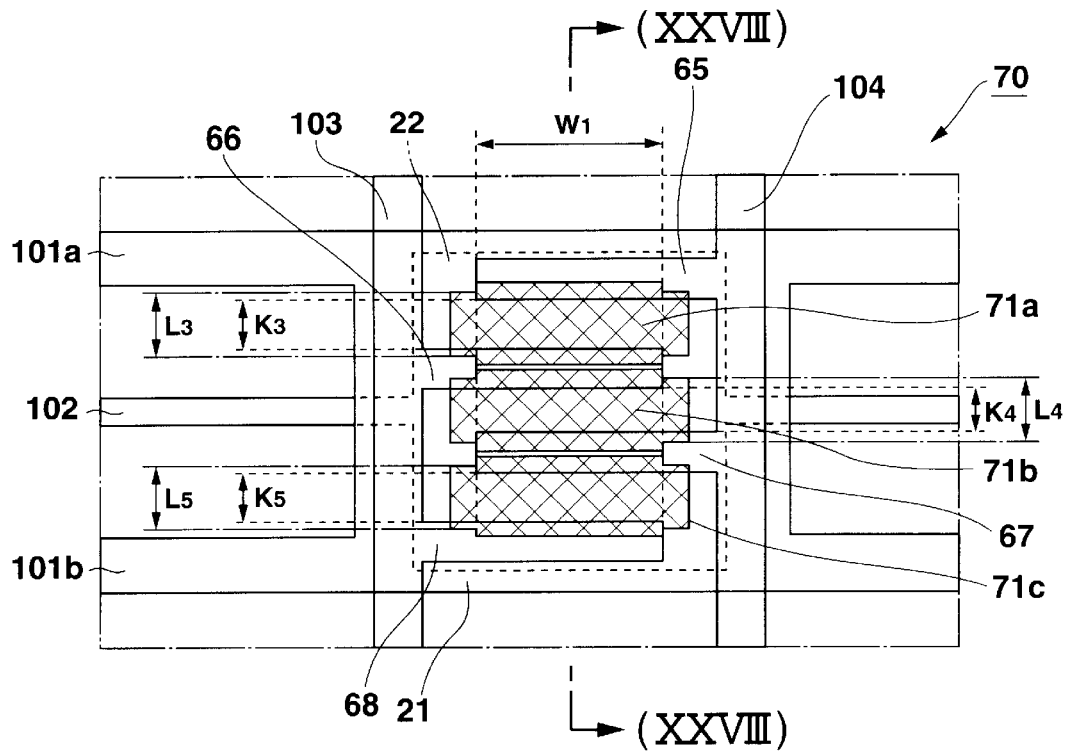
FIG. 27 is a plan view showing the structure of a double-gate photosensor which is provided with three semiconductor layers and has three channel regions and three carrier generating regions.

FIG. 27 schematically shows the configuration of another double-gate photosensor applied to a photosensor array according to the present invention. The same parts of the configuration as those of the double-gate photosensor 60 are indicated by the same reference numerals and explanation of them will be simplified.

Figure 28:
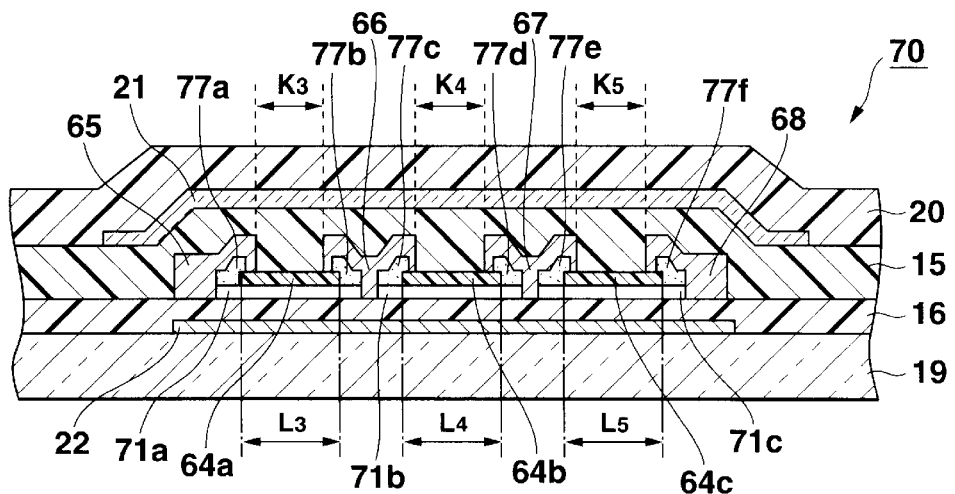
FIG. 28 is a sectional view taken along line XXVIII—XXVIII of FIG. 27.

As shown in FIG. 28, the double-gate photosensor 70 according to the present embodiment comprises a single bottom gate electrode 22 formed on an insulating substrate 19 that allows visible light to pass through, a bottom gate insulating film 16 provided on the bottom gate electrode 22 and insulating substrate 19, semiconductor layers 71a, 71b, 71c made of amorphous silicon or the like that are provided so as to face the bottom gate electrode 22 and generate electron-hole pairs by incident visible light, block insulating films 64a, 64b, 64c arranged apart in parallel on the semiconductor layers 71a, 71b, 71c, respectively, impurity doped layers 77a, 77b provided at both ends of the semiconductor layer 71a in the direction of channel length, respectively, impurity doped layers 77c, 77d provided at both ends of the semiconductor layer 71b in the direction of channel length, respectively, impurity doped layers 77e, 77f provided on both ends of the semiconductor layer 71c in the direction of channel length, respectively, a source electrode 65 provided on the impurity doped layer 77a, a drain electrode 66 provided so as to extend over the impurity doped layer 77b and impurity doped layer 77c, a source electrode 67 provided so as to expand over the impurity doped layer 77d and impurity doped layer 77e, a drain electrode 68 provided on the impurity doped layer 77f, a top gate insulating film 15 formed so as to cover the bottom gate electrode 16, block insulating films 64a, 64b, 64c, source electrodes 65, 67, and drain electrodes 66, 68, a single top gate electrode 21 provided on the top gate insulating film 15 facing the semiconductor layer 11, and a protective insulating film 20 provided on the top gate insulating film 15 and top gate electrode 21. The impurity doped layers 77a, 77b, 77c, 77d, 77e, 77f are made of amorphous silicon (n$^+$ silicon) doped with n-type impurities.

The double-gate photosensor 70 is such that a first double-gate photosensor made up of the semiconductor layer 71a, source electrode 65, drain electrode 66, top gate insulating film 15, bottom gate insulating film 16, top gate electrode 21, and bottom gate electrode 22, a second double-gate photosensor made up of the semiconductor layer 71b, source electrode 67, drain electrode 66, top gate insulating film 15, bottom gate insulating film 16, top gate electrode 21, and bottom gate electrode 22, and a third double-gate photosensor made up of the semiconductor layer 71c, source electrode 67, drain electrode 68, top gate insulating film 15, bottom gate insulating film 16, top gate electrode 21, and bottom gate electrode 22 are connected in parallel.

In the semiconductor layer 71a, the channel region in which the drain current of the first double-gate photosensor in the double-gate photosensor 60 flows is set as a rectangular shape whose two adjacent sides are defined by a channel length of $L_3$ and a channel width of $W_1$. In the semiconductor layer 71b, the channel region in which the drain current of the second doublegate photosensor flows is set as a rectangular shape whose two adjacent sides are defined by a channel length of $L_4$ and a channel width of $W_1$. In the semiconductor layer 71c, the channel region in which the drain current of the third double-gate photosensor flows is set as a rectangular shape whose two adjacent sides are defined by a channel length of $L_5$ and a channel width of $w_1$.

The drain current Ids flowing in the double-gate photosensor 70 is represented by the following expression (8):

$$Ids \propto (W_1/L_3 + W_1/L_4 + W_1/L_5) \quad (8)$$

The double-gate photosensor 70 is so constructed that the top gate electrode 21 and bottom gate electrode 22 constituting each of the first to third double-gate photosensors are made up of common electrodes, the source electrodes 65, 67 are formed by the projections from the common source line 104, and the drain electrodes 66, 68 are formed by the projections from the common drain line 103. Because the double-gate photosensors 70 are arranged in a matrix, thereby forming a photosensor array 300, the three double-gate photosensors 70 can be operated as a single double-gate photosensor by the above-described driving control method, which produces a similar effect as the double-gate photosensor 60.

While in each of the embodiments, each of the double-gate photosensors 10, 50, 60, 70 is such that one to three semiconductor layers (or double-gate photosensors) are arranged, two to three channel regions in which the drain current flows are provided, and two to three carrier generating regions are provided, these elements being arranged in parallel in the direction of channel length, the present invention is not limited to this. The light-receiving sensitivity can be set arbitrarily according to the number of semiconductor layers arranged consecutively.

When the double-gate photosensors 10, 50, 60, 70 are arranged in a matrix to construct the photosensor arrays 100, 200, 300 and these arrays are applied to a two-dimensional reading device, because light from the insulating substrate (or glass substrate) 19 side is projected through the element-to-element region Rp in the lattice of the matrix onto the subject, it is necessary to set the element-to-element region Rp so as to secure a sufficient amount of light projected on the subject and then set arbitrarily the number of semiconductor layers (double-gate photosensors) arranged consecutively in the region where a light-receiving section is to be formed.

Figure 29:
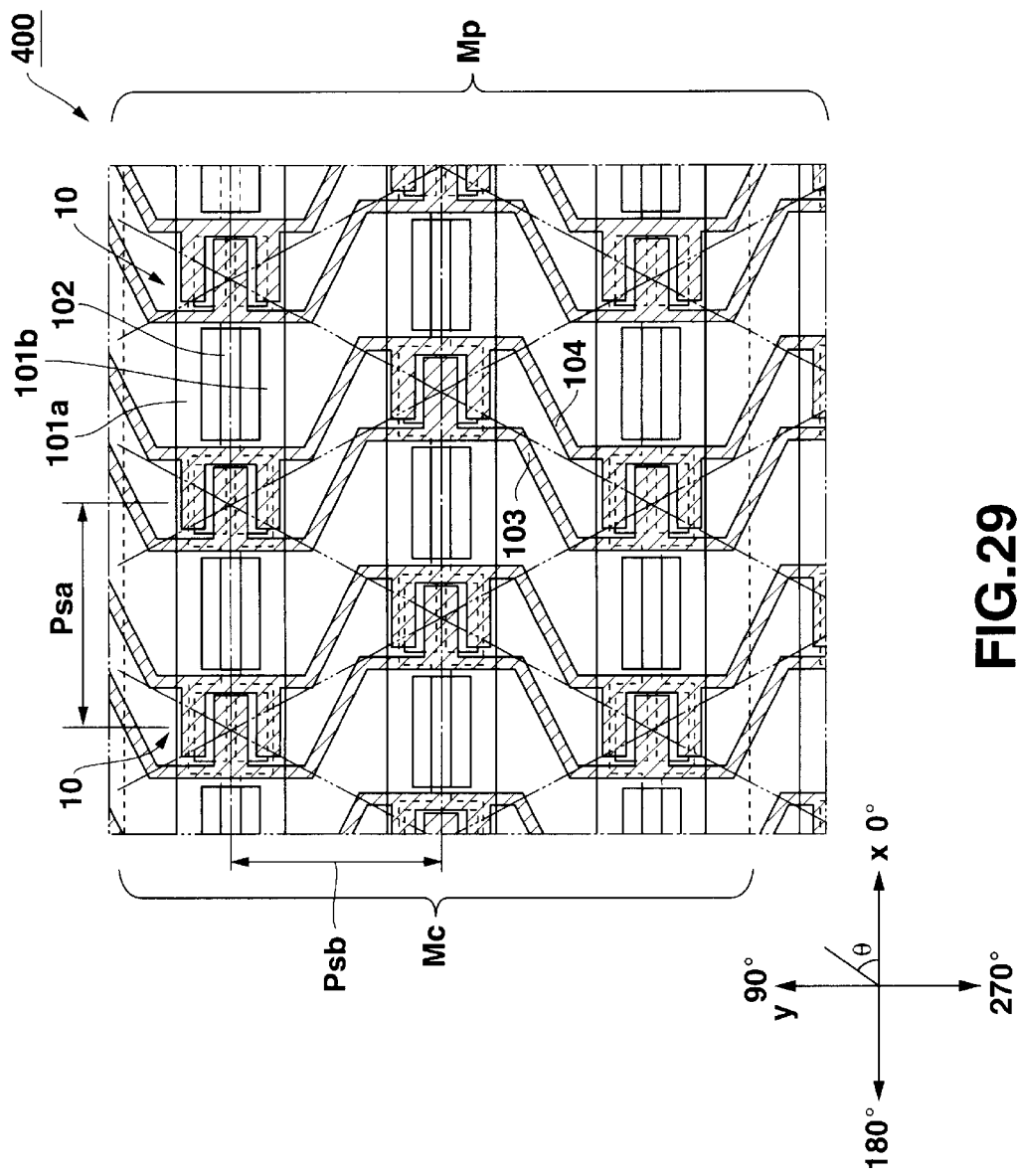
FIG. 29 is a plan view of a photosensor array composed of a delta arrangement of double-gate photosensors applied to the present invention.

FIG. 29 schematically shows still another embodiment of the photosensor array according to the present invention.

A photosensor array 400 according to the present embodiment includes double-gate photosensors 10 and has a so-called delta arrangement structure where the double-gate photosensors 10 are placed at the respective apexes of an equilateral triangle continuously set in a two-dimensional plane whose one side is Psa. A photosensor system provided with the photosensor array 400 is such that the photosensor array 100 of FIG. 6 is replaced with the photosensor array 400.

The photosensor array 100 of FIG. 6 encounters a problem in arranging double-gate photosensors 10: since the double-gate photosensors 10 are arranged in such a manner that they are spaced at-equal intervals of dimension Psp only in the two directions of x and y perpendicular to each other, the pitch between the double-gate photosensors 10 increases in the directions of x and y non-uniformly (for example, the distance of the double-gate photosensors 10 arranged obliquely at an angle of 45° to the direction of x or y is $\sqrt{2}$ times the pitch Psp) in an oblique direction at an angle of θ (a suitable angle other than 0°, 90°, 180°, and 270°, for example, in the direction of 45° or 60°) to the directions of x and y, and therefore, the accuracy with which a subject placed obliquely is read cannot be realized as uniformly as and as highly as the accuracy with which a subject not shifted is read.

In contrast, in the photosensor array 400 according to the present embodiment, since the double-gate photosensors 10 acting as light-receiving sections are placed at the respective apexes of each equilateral triangle continuously set in a two-dimensional plane, the double-gate photosensors 10C are arranged uniformly in the direction of x. At the same time, even when the angle is 60°, 120°, 240°, or 300°, the double-gate photosensors 10C are arranged uniformly, equalizing the pitch between the light-receiving sections. This assures operation with the same accuracy, even when the subject is shifted through an angle of 60°, 120°, 240°, or 300°.

Since all the double-gate photosensors arranged on a two-dimensional surface are positioned with an equal pitch of Psa for the adjacent double-gate photosensors in almost all the directions, even when a two-dimensional image to be read is placed obliquely to the directions of x and y, the image can be read correctly with a high reading accuracy, while distortions in reading the image is being suppressed.

Since the double-gate photosensors are arranged in delta, when the pitch Psa in the direction of x is set equal to the pitch Psp of the photosensor of FIG. 6, the pitch Psb in the direction of y is represented by expression (9):

$$Psb = Psa \times \sin 60° \quad (9)$$

As described above, because the pitch Psb in the direction of y is shorter than the pitch Psa (=Psp) in the direction of x, the photosensor array 400 enables the same number of double-gate photosensors 10c to be arranged in the plane region Mc reduced in the direction of y in the plane region Mp equivalent to the photosensor array 100, which makes the two-dimensional image reading device smaller. In other words, the photosensor array 400 enables 1/sin 60° times (1.15 times) as many double-gate photosensors 10c to be placed in the plane region Mp equivalent to the photosensor 100, which enables a high packing density of sensor elements to be obtained.

While in the delta arrangement, the double-gate photosensors 10 of the embodiment of FIG. 1 have been used as the double-gate photosensors constituting the light-receiving sections, any of the double-gate photosensors PS, 50, 60, and 70 in the other embodiments may be used. It goes without saying that double-gate photosensors of still another structure may be used.

In the double-gate photosensor arrays 100, 200, 300, 400 described above, the top gate lines 101a, 101b in the same row are so formed that they are branched in two in a plane between the adjacent double-gate photosensors 19 (or any of PS, 50, 60, and 70), and extend in parallel while keeping the uniform positional relationship and an almost equal wiring width. Specifically, the two top gate lines 101a, 101b are arranged and formed so as to have an almost symmetric positional relationship in the direction of column above and below the bottom gate line 102 that connects a near center of the double-gate photosensor 10 (or any of PS, 50, 60, and 70) and extends.

With such a configuration, since the top gate electrodes 21 are basically connected by two (or plural) wiring layers, the cross-sectional area of the wiring is increased to an integral multiple of the original. This reduces the wiring resistance of the top gate lines 101a, 101b made of ITO of high resistivity, suppressing a delay in the read operation signal, which realizes the operation of reading far better images. Moreover, since the top gate lines at a relatively upper layer in the double-gate photosensor of the stacked structure are made of plural wiring layers (110a, 101b), even if a specific wiring layer constituting the top gate line has broken due to steps resulting from the staked structure, the top gate electrodes 21 can be connected to each other electrically by the remaining wiring layers with no break, compensating for the propagation of the read operation signal, which provides a highly reliable photosensor array.

Furthermore, because the light-receiving sensitivity of the photosensor array is increased remarkably, the illuminance of the plane light source 30 is decreased relatively, which reduces the power consumption of the image reading device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A photosensor system comprising:
    (a) a plurality of photosensors, each including:
        a first gate electrode,
        a first gate insulating film provided above said first gate electrode,
        source and drain electrodes provided above said first gate insulating film,
        a semiconductor layer provided between said source and drain electrodes, and having a carrier generating region for generating carriers by incident exciting light and a plurality of channel regions separated from each other so as to prevent an electric field between said source and drain electrodes from concentrating,
        first and second impurity doped layers respectively connected to the source and drain electrodes, and separated from each other such that the first and second impurity doped lavers define a channel therebetween in the semiconductor layer, and such that a distance between the first and second impurity doped layers is constant at any part of the channel for matching a length of the channel;
        a second gate insulating film provided above said semiconductor layer, and
        a second gate electrode provided above said second gate insulating film;
    (b) a first gate line connecting said first gate electrodes of said photosensors to each other; and
    (c) a second gate line connecting said second gate electrodes of said photosensors to each other and arranged apart from said first gate line in a plane between adjacent photosensors.

2. The photosensor system according to claim 1, wherein said second gate line is made of material that allows said exciting light to pass through.

3. The photosensor system according to claim 1, wherein said second gate line is formed integrally with said second gate electrode.

4. The photosensor system according to claim 1, further comprising a first gate driver for supplying a signal to said first gate line for selectively bringing said photosensors into one of a selection state and a non-selection state, and a second gate driver for supplying a signal to said second gate line for selectively bringing said photosensors into one of a reset state and a carrier accumulated state.

5. A photosensor system comprising:
    (a) a plurality of photosensors arranged in a matrix, with an interval between adjacent photosensors in a row direction being equal in length to an interval between the adjacent photosensors in a column direction, each photosensor including:
        a first gate electrode,
        a first gate insulating film provided above said first gate electrode,
        source and drain electrodes provided above said first gate insulating film,
        a semiconductor layer provided between said source and drain electrodes, and having a plurality of carrier generating regions for generating carriers by incident exciting light and a plurality of channel regions separated from each other so as to prevent an electric field between said source and drain electrodes from concentrating,
        first and second impurity doped layers respectively connected to the source and drain electrodes, and separated from each other such that the first and second impurity doped layers define a channel therebetween in the semiconductor layer, and such that a distance between the first and second impurity doped layers is constant at any tart of the channel for matching a length of the channel;
        a second gate insulating film provided above said semiconductor layer, and
        a second gate electrode provided above said second gate insulating film;
    (b) source lines connected to the source electrodes of said photosensors arranged in a first direction;
    (c) drain lines connected to the drain electrodes of said photosensors arranged in said first direction;
    (d) first gate lines connected to the first gate electrodes of said photosensors arranged in a second direction;
    (e) second gate lines connected to the second gate electrodes of said photosensors arranged in said second direction;
    (f) precharging means for outputting a precharge voltage to said drain lines;
    (g) reading means for reading the precharge voltage, as varied according to incident light on said photosensors;
    (h) a first gate driver for supplying a signal to said first gate lines for selectively bringing said photosensors into one of a selection state and a non-selection state; and
    (i) a second gate driver for supplying a signal to said second gate lines for selectively bringing said photosensors into one of a reset state and a carrier accumulated state.

6. The photosensor system according to claim 5, further comprising a light source for emitting light including said exciting light.

7. A photosensor system comprising:
(a) a plurality of photosensors arranged in a matrix, with an interval between adjacent photosensors in a row direction being equal in length to an interval between the adjacent photosensors in a column direction, each photosensor including:
a first gate electrode,
a first gate insulating film provided above said first gate electrode,
source and drain electrodes provided above said first gate insulating film,
a plurality of semiconductor layers provided between said source and drain electrodes, and each having a carrier generating region for generating carriers by incident exciting light and a channel region, said channel regions being arranged so that there is distance between the channel regions for preventing an electric field between said source and drain electrodes from concentrating,
first and second impurity doped layers respectively connected to the source and drain electrodes, and separated from each other such that the first and second impurity doped layers define the channel region therebetween in each of the semiconductor layers, and such that a distance between the first and second impurity doped layers is constant at any part of the channel region for matching a length of the channel region;
a second gate insulating film provided above said semiconductor layers, and
a second gate electrode provided above said second gate insulating film;
(b) source lines connected to the source electrodes of said photosensors arranged in a first direction;
(c) drain lines connected to the drain electrodes of said photosensors arranged in said first direction;
(d) first gate lines connected to the first gate electrodes of said photosensors arranged in a second direction;
(e) second gate lines connected to the second gate electrodes of said photosensors arranged in said second direction;
(f) precharging means for outputting a precharge voltage to said drain lanes;
(g) reading means for reading the precharge voltage, as varied according to incident light on said photosensors;
(h) a first gate driver for supplying a signal to said first gate lines for selectively bringing said photosensors into one of a selection state and a non-selection state; and
(i) a second gate driver for supplying a signal to said second gate lines for selectively bringing said photosensors into one of a reset state and a carrier accumulated state.

8. The photosensor system according to claim 7, further comprising a light source for emitting light including said exciting light.

9. A photosensor system comprising:
(a) a plurality of photosensors arranged in a matrix, with an interval between adjacent photosensors in a row direction being equal in length to an interval between the adjacent photosensors in a column direction, each photosensor including:
a first gate electrode,
a first gate insulating film provided above said first gate electrode,
source and drain electrodes provided above said first gate insulating film,
a plurality of semiconductor layers provided between said source and drain electrodes, and each having a plurality of carrier generating regions for generating carriers by incident exciting light and a plurality of channel regions, said plurality of channel regions being arranged so that there is distance between the channel regions for preventing an electric field between said source and drain electrodes from concentrating,
first and second impurity doped layers respectively connected to the source and drain electrodes, and separated from each other such that the first and second impurity dosed layers define the channel region therebetween in each of the semiconductor layers, and such that a distance between the first and second impurity doped layers is constant at any part of the channel region for matching a length of the channel region;
a second gate insulating film provided above said semiconductor layers, and
a second gate electrode provided above said second gate insulating film;
(b) source lines connected to the source electrodes of said photosensors arranged in a first direction;
(c) drain lines connected to the drain electrodes of said photosensors arranged in said first direction;
(d) first gate lines connected to the first gate electrodes of said photosensors arranged in a second direction;
(e) second gate lines connected to the second gate electrodes of said photosensors arranged in said second direction;
(f) precharging means for outputting a precharge voltage to said drain lines;
(g) reading means for reading the precharge voltage, as varied according to incident light on said photosensors;
(h) a first gate driver for supplying a signal to said first gate lines for selectively bringing said photosensors into one of a selection state and a non-selection state; and
(i) a second gate driver for supplying a signal to said second gate lines for selectively bringing said photosensors into one of a reset state and a carrier accumulated state.

10. The photosensor system according to claim 9, further comprising a light source for emitting light including said exciting light.

11. A photosensor system comprising:
a plurality of photosensors arranged in a matrix, with an interval between adjacent photosensors in a row direction being equal in length to an interval between the adjacent photosensors in a column direction, each photosensor including:
a first gate electrode for selectively bringing said photosensors into one of selection state and a non-selection state,
a first gate insulating film provided above said first gate electrode,
source and drain electrodes provided above said first gate insulating film,
a semiconductor layer provided between said source and drain electrodes, and having a plurality of channel regions separated from each other so as to prevent an electric field between said source and drain electrodes from concentrating, first and second impurity doped layers respectively connected to the source and drain electrodes, and separated from each other such that the first and second impurity dosed layers define the channel region therebetween in the semiconductor layer, and such that a distance between the first and second impurity doped layers is constant at any part of the channel region for matching a length of the channel region;

a second gate insulating film provided above said semiconductor layer, and a second gate electrode for selectively bringing said photosensors into one of a reset state and a carrier accumulated state, said second gate electrode being provided above said second gate insulating film.

12. A photosensor system comprising:

a plurality of photosensors arranged in a matrix, with an interval between adjacent photosensors in a row direction being equal in length to an interval between the adjacent photosensors in a column direction, each photosensor including:

a first gate electrode for selectively bringing said photosensors into one of a selection state and a non-selection state, a first gate insulating film provided above said first gate electrode, source and drain electrodes provided above said first gate insulating film, a plurality of semiconductor layers provided between said source and drain electrodes, and each having a channel region, said channel regions being arranged so that there is distance between the channel regions for preventing an electric field between said source and drain electrodes from concentrating, first and second impurity doped layers respectively connected to the source and drain electrodes, and separated from each other such that the first and second impurity doped layers define the channel region therebetween in each of the semiconductor layers, and such that a distance between the first and second impurity doped layers is constant at any part of the channel region for matching a length of the channel region;

a second gate insulating film provided above said semiconductor layers, and a second gate electrode for selectively bringing said photosensors into one of a reset state and a carrier accumulated state, said second gate electrode being provided above said second gate insulating film.

13. A photosensor system comprising:

a plurality of photosensors arranged in a matrix, with an interval between adjacent photosensors in a row direction being equal in length to an interval between the adjacent photosensors in a column direction, each photosensor including:

a first gate electrode for selectively bringing said photosensors into one of a selection state and a non-selection state, a first gate insulating film provided above said first gate electrode, source and drain electrodes provided above said first gate insulating film, a plurality of semiconductor layers provided above said first gate insulating film, and each having a plurality of channel regions arranged so that there is distance between the channel regions for preventing an electric field between said source and drain electrodes from concentrating, first and second impurity doped layers respectively connected to the source and drain electrodes, and separated from each other such that the first and second impurity doped layers define the channel region therebetween in each of the semiconductor layers, and such that a distance between the first and second impurity doped layers is constant at any part of the channel region for matching a length of the channel region;

a second gate insulating film provided above said semiconductor layers, and a second gate electrode for selectively bringing said photosensors into one of a reset state and a carrier accumulated state, said second gate electrode being provided above said second gate insulating film.

14. A photosensor comprising:

a first gate electrode;

a first gate insulating film provided above said first gate electrode;

source and drain electrodes provided above said first gate insulating film;

a semiconductor layer provided between said source and drain electrodes, and having a plurality of channel regions separated from each other so as to prevent an electric field between said source and drain electrodes from concentrating;

first and second impurity doped lavers respectively connected to the source and drain electrodes, and separated from each other such that the first and second impurity doped layers define a channel therebetween in the semiconductor layer, and such that a distance between the first and second impurity doped layers is constant at any part of the channel for matching a length of the channel;

a second gate insulating film provided above said semiconductor layer; and a second gate electrode provided above said second gate insulating film.

15. The photosensor according to claim 14, wherein said channel regions are arranged side by side.

16. The photosensor according to claim 14, wherein each of channel lengths of said channel regions equals in length.

17. The photosensor according to claim 14, wherein each of said channel regions equals in shape.

18. The photosensor according to claim 14, wherein said semiconductor layer has a plurality of carrier generating regions for generating carriers when struck by exciting light.

19. The photosensor according to claim 18, wherein said carrier generating regions are arranged side by side in a direction of a channel length of at least one of said channel regions.

20. The photosensor according to claim 14, wherein a plurality of at least one of said source and drain electrodes is provided.

21. The photosensor according to claim 14, wherein one of said source and drain electrodes is arranged between adjacent ones of said channel regions.

22. A photosensor comprising:

a first gate electrode;

a first gate insulating film provided above said first gate electrode;

source and drain electrodes provided above said first gate insulating film;

a plurality of semiconductor layers provided between said source and drain electrodes, and each having a channel region, said channel regions being arranged so that there is distance between the channel regions to prevent an electric field between said source and drain electrodes from concentrating;

first and second impurity doped layers respectively connected to the source and drain electrodes, and separated from each other such that the first and second impurity doped layers define the channel region therebetween in each of the semiconductor layers, and such that a distance between the first and second impurity doped layers is constant at any part of the channel region for matching a length of the channel region;

a second gate insulating film provided above said semiconductor layer; and a second gate electrode provided above said second gate insulating film.

23. A photosensor comprising:

a first gate electrode;

a first gate insulating film provided above said first gate electrode;

source and drain electrodes provided above said first gate insulating film;

a plurality of semiconductor layers provided between said source and drain electrodes, and each having a plurality of channel regions separated from each other so as to prevent an electric field between said source and drain electrodes from concentrating;

first and second impurity doped layers respectively connected to the source and drain electrodes, and separated from each other such that the first and second impurity doped layers define the channel region therebetween in each of the semiconductor layers, and such that a distance between the first and second impurity doped layers is constant at any part of the channel region for matching a length of the channel region;

a second gate insulating film provided above said semiconductor layers; and a second gate electrode provided above said second gate insulating film.

* * * * *

UNITED STATES PATENT AND TRADEMARK OFFICE
CERTIFICATE OF CORRECTION

PATENT NO.     : 6,670,595 B1
DATED          : December 30, 2003
INVENTOR(S)    : Kazuhiro Sasaki It is certified that error appears in the above-identified patent and that said Letters Patent is hereby corrected as shown below:

<u>Title page,</u>
Item [73], Assignee: change "Olympus Optical Co., Ltd.," to -- Casio Computer Co., Ltd., --

Signed and Sealed this

Sixth Day of April, 2004

JON W. DUDAS
*Acting Director of the United States Patent and Trademark Office*